(12) United States Patent
Matsuura et al.

(10) Patent No.: US 8,232,161 B2
(45) Date of Patent: Jul. 31, 2012

(54) SEMICONDUCTOR DEVICE AND MANUFACTURING METHOD OF THE SAME

(75) Inventors: Hitoshi Matsuura, Tokyo (JP); Yoshito Nakazawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/970,911

(22) Filed: Dec. 16, 2010

(65) Prior Publication Data

US 2011/0086480 A1 Apr. 14, 2011

Related U.S. Application Data

(62) Division of application No. 11/927,375, filed on Oct. 29, 2007, now Pat. No. 7,880,225.

(30) Foreign Application Priority Data

Oct. 31, 2006 (JP) .................................. 2006-295435

(51) Int. Cl.
*H01L 21/823* (2006.01)

(52) U.S. Cl. ........................ 438/238; 438/270; 438/271

(58) Field of Classification Search .......... 438/270–271, 438/238; 257/E21.616
See application file for complete search history.

(56) References Cited

U.S. PATENT DOCUMENTS

| 6,977,416 B2 | 12/2005 | Nakazawa et al. |
| 8,049,270 B2 * | 11/2011 | Akiyama et al. ............ 257/328 |

FOREIGN PATENT DOCUMENTS

| JP | 63-229758 A | 9/1988 |
| JP | 2005-057049 A | 3/2005 |

* cited by examiner

*Primary Examiner* — Cuong Q Nguyen
*Assistant Examiner* — Tran Tran
(74) *Attorney, Agent, or Firm* — Miles & Stockbridge P.C.

(57) ABSTRACT

A trench is formed so as to reach a p⁻-type epitaxial layer from an upper surface of a source region. A gate electrode is formed so as to bury the trench. Each of body contact trenches is formed away from the gate electrode. A body contact region is formed at the bottom of the body contact trench. An n-type semiconductor region that is a feature of the present invention is formed in a layer below each body contact region. The impurity concentration of the n-type semiconductor region is higher than a channel forming area and lower than the body contact region.

7 Claims, 29 Drawing Sheets

DEPTH OF n-TYPE SEMICONDUCTOR REGION 34/DEPTH OF CHANNEL FORMING AREA 27

FIG. 26
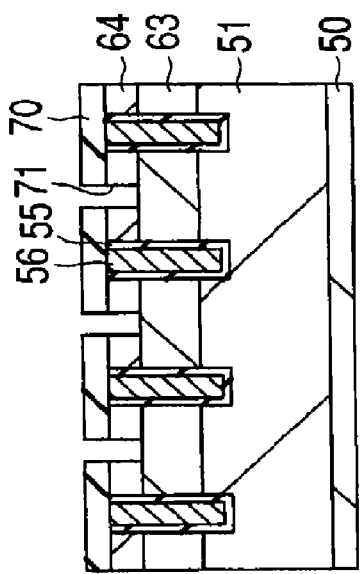
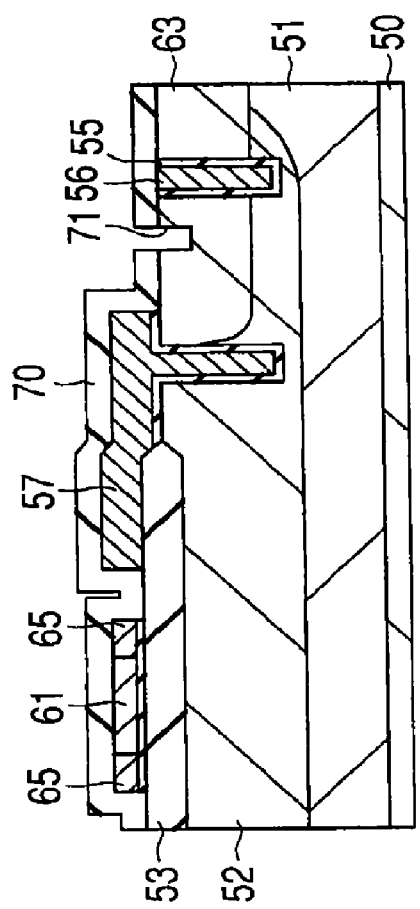
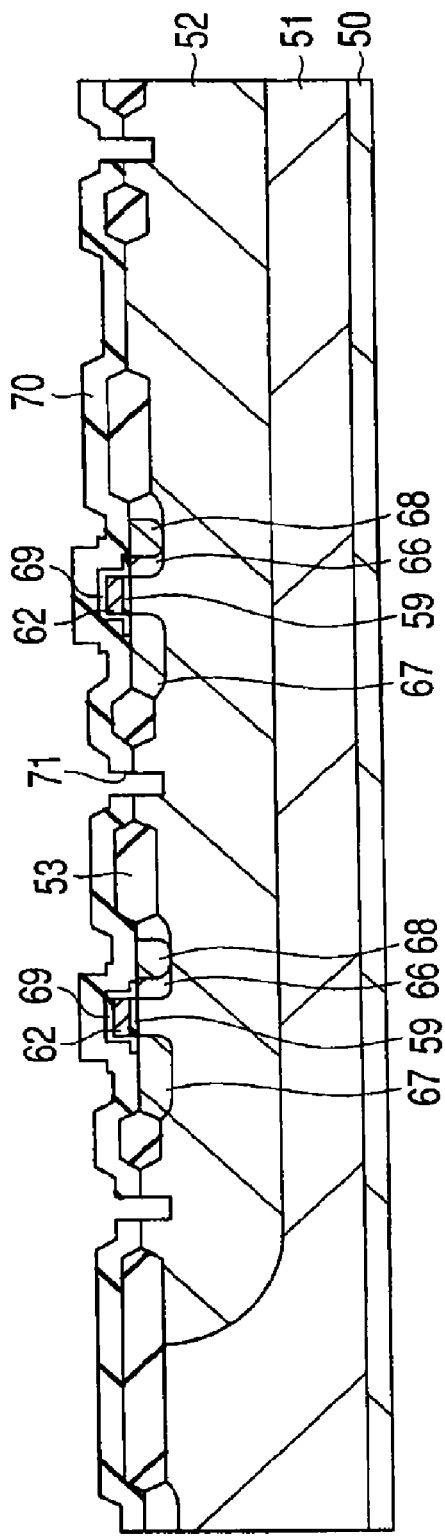

SEMICONDUCTOR DEVICE AND MANUFACTURING METHOD OF THE SAME

CROSS-REFERENCE TO RELATED APPLICATION

This application is a division of application Ser. No. 11/927,375 filed Oct. 29, 2007 now U.S. Pat. No. 7,880,225. Also, the disclosure of Japanese patent application No. 2006-295435 filed on Oct. 31, 2006 including the specification, drawings and abstract is incorporated herein by reference in its entirety.

BACKGROUND OF THE INVENTION

The present invention relates to a semiconductor device and its manufacturing technology, and particularly to a semiconductor device in which a trench gate type MISFET (Metal Insulator Semiconductor Field Effect Transistor) having a p channel is provided with an overheat cutoff circuit, and a technology effective if applied to its manufacture.

A power MISFET with an overheat cutoff circuit built therein has been disclosed in Japanese Unexamined Patent Publication No. Sho 63(1988)-229758 (Patent Document 1). According to a technology described in the patent document 1, a gate resistor is provided between a gate electrode of the power MISFET and an external gate terminal (gate pad). Further, a protection circuit MISFET is provided between the gate electrode of the power MISFET and a source electrode thereof. When the power MISFET is brought to an overheated state, the protection circuit MISFET is turned on to allow current to flow through the gate resistor. Thus, the voltage applied to the gate electrode of the power MISFET is reduced to turn off the power MISFET, thereby preventing device breakdown due to overheating.

A technology for enhancing avalanche capability or breakdown tolerance of a trench gate type power MISFET having an n channel has been disclosed in Japanese Unexamined Patent Publication No. 2005-57049 (Patent Document 2). Described specifically, a $p^+$-type semiconductor region is formed at the bottom of a contact trench or groove of the trench gate type power MISFET. A p-type semiconductor region, which contacts the $p^+$-type semiconductor region and an $n^-$-type monocrystalline silicon layer and is lower in impurity concentration than the $p^+$-type semiconductor region, is formed below the $p^+$-type semiconductor region. Further, an n-type semiconductor region, which contacts the p-type semiconductor region and is higher in impurity concentration than the $n^-$-type monocrystalline silicon layer, is formed in the $n^-$-type monocrystalline silicon layer below the p-type semiconductor region.

SUMMARY OF THE INVENTION

A high power-purpose transistor capable of treating a power of a few watts or higher is called power transistor. Ones having various structures exist. As to power MISFETs of all, there are known ones called so-called vertical and lateral structures depending upon the direction of current flowing through a channel. Further, there are known structures called a trench gate type power MISFET and a planar type power MISFET according to the structures of their gate electrodes. As to such power MISFETs, a large number of the power MISFETs are used with being connected in parallel to obtain high power.

The power MISFETs are classified into a p channel power MISFET and an n channel power MISFET depending on the type of carriers flowing through their channels. In the p channel power MISFET, positive holes are used as a majority carrier. In the n channel power MISFET, electrons are used as a majority carrier.

In general, a p channel trench gate type power MISFET has the feature that it is hard to cause avalanche breakdown as compared with an n channel trench gate type power MISFET. This is because the current amplification gain (hFE) of a pnp bipolar transistor parasitically existing in the p channel trench gate type power MISFET is much smaller than that of an npn bipolar transistor parasitically existing in the n channel trench gate type power MISFET. This is also because the mobility of positive holes corresponding to carriers of the p channel trench gate type power MISFET is smaller by about ¼ than the mobility of electrons corresponding to carriers of the n channel trench gate type power MISFET. Accordingly, it can be said that the shortage of avalanche capability becomes almost insignificant in the single p channel trench gate type power MISFET.

Here, there is known a power MISFET with an overheat cutoff circuit built therein in order to prevent breakdown of the power MISFET and enhance its reliability. As described in the patent document 1, for example, there is known, as the overheat cutoff circuit, one provided with a gate resistor between a gate electrode of a power MISFET and a gate terminal (gate pad) and provided with a protection circuit MISFET between the gate electrode of the power MISFET and a source electrode thereof. According to the overheat cutoff circuit, when the power MISFET is brought to an overheated state, the protection circuit MISFET is turned on to allow current to flow through the gate resistor. Thus, the voltage applied to the gate electrode of the power MISFET is lowered to turn off the power MISFET, thereby preventing device breakdown due to overheating.

As the power MISFET with the overheat cutoff circuit built therein, there is known one wherein an overheat cutoff circuit is incorporated in a p channel trench gate type power MISFET. The p channel trench gate type power MISFET with the overheat cutoff circuit built therein has caused a problem that avalanche capability (L load tolerance or capability) is reduced with respect to a target value. It is understood that since a single p channel trench gate type power MISFET presents no problem in terms of avalanche capability, and a p channel planar type power MISFET with an overheat cutoff circuit of the same circuit configuration built therein has sufficiently high avalanche capability, this problem is a problem peculiar to the p channel trench gate type power MISFET with the overheat cutoff circuit built therein.

An object of the present invention is to provide a technique capable of enhancing reliability in a semiconductor device in which a trench gate type MISFET having a p channel is provided with an overheat cutoff circuit.

The above, other objects and novel features of the present invention will become apparent from the description of the present specification and the accompanying drawings.

Summaries of representative ones of the inventions disclosed in the present application will be explained in brief as follows:

A semiconductor device according to the present invention relates to a semiconductor device including a trench gate type MISFET having a p-type channel and a resistive element provided between a gate pad and a gate electrode of the trench gate type MISFET. The semiconductor device includes (a) a semiconductor substrate, (b) a p-type semiconductor region formed over the semiconductor substrate, (c) an n-type channel forming area formed over the p-type semiconductor region, and (d) a p-type source region formed over the n-type channel forming area. Further, the semiconductor device includes (e) a trench which extends from an upper surface of the p-type source region to the p-type semiconductor region, (f) a gate insulating film formed over an inner wall of the trench, and (g) a gate electrode formed over the gate insulating film and formed so as to bury the trench. The semiconductor device includes (h) a first n-type semiconductor region formed within the n-type channel forming area and having an impurity introduced therein in a concentration higher than the n-type channel forming area, and (i) a second n-type semiconductor region formed in an area deeper than the first n-type semiconductor region and shallower than the bottom of the trench, which has an impurity introduced therein in a concentration lower than the first n-type semiconductor region and an impurity introduced therein in a concentration higher than the n-type channel forming area.

A method for manufacturing a semiconductor device according to the present invention relates to a method of manufacturing a semiconductor device including a trench gate type MISFET having a p-type channel and a resistive element provided between a gate pad and a gate electrode of the trench gate type MISFET. The method includes the steps of (a) forming a p-type semiconductor region over a semiconductor substrate, (b) forming a trench in the p-type semiconductor region, (c) forming a gate insulating film over an inner wall of the trench, and (d) forming a gate electrode so as to bury the trench. Further, the method includes the steps of (e) forming an n-type channel forming area in an area shallower than the trench of the p-type semiconductor region, (f) forming a p-type source region in a surface region shallower than the bottom of the n-type channel forming area, and (g) forming a first n-type semiconductor region in the n-type channel forming area. The method includes the step of (h) forming a second n-type semiconductor region in an area deeper than the first n-type semiconductor region and shallower than the bottom of the trench. An impurity concentration of the second n-type semiconductor region is lower than that of the first n-type and higher than that of the n-type channel forming area.

Advantageous effects obtained by a representative one of the inventions disclosed in the present application will be explained in brief as follows:

A high-concentration n-type semiconductor region of the same conduction type as a channel forming area is formed directly below each body contact region. Thus, a point brought to avalanche breakdown with a pn junction existing in the boundary between the channel forming area and a drain region can be formed to a position spaced away from a sidewall of a trench gate electrode. Therefore, it is possible to suppress the flowing of an electron current produced upon the avalanche breakdown through the sidewall of the trench gate electrode and to reduce electrons injected into the gate electrode. As a result, it is possible to prevent a voltage drop developed across a resistive element connected in series with the gate electrode and to prevent a phenomenon that a p channel trench gate type power MISFET is turned on so that its device operation exceeds an area of safe operation, whereby the p channel trench gate type power MISFET is brought to thermal breakdown.

BRIEF DESCRIPTION OF THE DRAWINGS

FIG. 26 is a sectional view following FIG. 25, showing the semiconductor device manufacturing process;

DETAILED DESCRIPTION OF THE PREFERRED EMBODIMENTS

Figure 1:
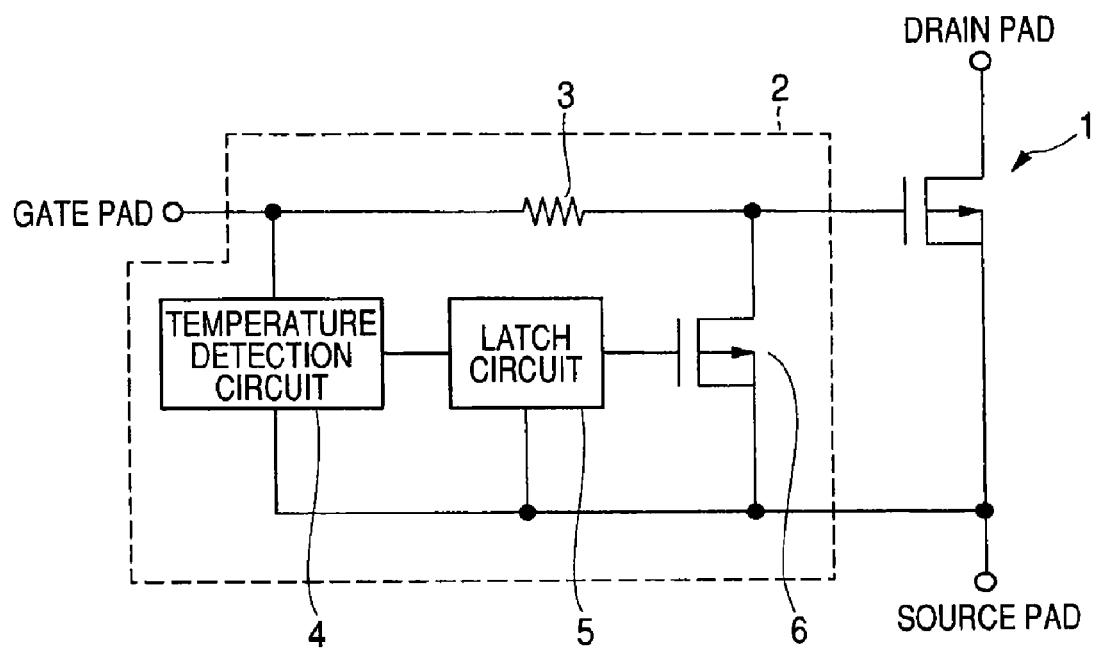
FIG. 1 is a circuit block diagram showing a p channel trench gate type power MISFET with an overheat cutoff circuit built therein in a first embodiment of the present invention.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components or constituent elements (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Throughout all drawings for describing the embodiments, identical members are respectively identified by the same reference numerals in principle and their repetitive explanations will therefore be omitted. Incidentally, some hatching might be provided to make it easy to read the drawings even in the case of plan views.

First Preferred Embodiment

A semiconductor device according to a first embodiment will be explained with reference to the accompanying drawings. The semiconductor device according to the first embodiment is a p channel trench gate type power MISFET with an overheat cutoff circuit built therein. The trench gate type power MISFET is of a power MISFET of a structure in which a gate electrode is formed so as to be embedded in its corresponding trench (groove) formed in the direction of the thickness of a semiconductor substrate. A p channel indicates that a major carrier of the power MISFET is a positive hole.

FIG. 1 is a circuit block diagram showing a p channel trench gate type power MISFET 1 with an overheat cutoff circuit built therein. In FIG. 1, the overheat cutoff circuit 2 is connected to the p channel trench gate type power MISFET 1. The overheat cutoff circuit 2 is of a circuit for forcibly turning off the p channel trench gate type power MISFET 1 to protect it when the p channel trench gate type power MISFET 1 is brought to an overheated state.

The overheat cutoff circuit 2 has a gate cutoff resistor 3, a temperature detection circuit 4, a latch circuit 5 and a protective MISFET 6. The gate cutoff resistor 3 is provided in series between a gate electrode of the p channel trench gate type power MISFET 1 and a gate pad. The protective MISFET 6 is formed between the gate cutoff resistor 3 and a source pad to which a source region of the p channel trench gate type power MISFET 1 is connected. Further, the temperature detection circuit 4 and the latch circuit 5 are connected between the gate pad and the source pad. The latch circuit 5 is connected to the gate electrode of the protective MISFET 6. As the temperature detection circuit 4, for example, one using a diode can be used. That is, since the diode changes in resistance with a change in temperature, the temperature can be detected by utilizing the change in resistance with its temperature change.

Next, the operation of the overheat cutoff circuit 2 will be explained. At normal times, a gate voltage is inputted from the gate pad shown in FIG. 1 to the gate electrode of the p channel trench gate type power MISFET 1. In doing so, the p channel trench gate type power MISFET 1 is turned on to allow current to flow between the drain pad and the source pad. When, at this time, a load (not shown) connected to the p channel trench gate type power MISFET 1 is short-circuited on a system due to some reasons, for example, a power supply voltage is applied to the p channel trench gate type power MISFET 1 while the gate electrode remains in a turned-on state, so that the p channel trench gate type power MISFET 1 is brought into a state in which a large current (saturated current of MISFET) flows. Therefore, the p channel trench gate type power MISFET 1 is brought into an overheated state. Since the p channel trench gate type power MISFET 1 is brought to destruction when its overheated state continues, the overheat cutoff circuit 2 operates.

First, the temperature detection circuit 4 detects the temperature of the p channel trench gate type power MISFET 1. When the temperature of the p channel trench gate type power MISFET 1 reaches a predetermined temperature or higher, the temperature detection circuit 4 turns on the protective MISFET 6 via the latch circuit 5. In doing so, a cutoff current flows between the gate pad and the source pad through the protective MISFET 6. Since the cutoff current flows through even the gate cutoff resistor 3, a voltage drop is developed due to the flow of the cutoff current through the gate cutoff resistor 3. In doing so, the voltage applied to the gate electrode of the p channel trench gate type power MISFET 1 becomes a threshold voltage or less, so that the p channel trench gate type power MISFET1 is turned off. Thus, when the p channel trench gate type power MISFET 1 is overheated, the p channel trench gate type power MISFET 1 is forcibly turned off by operating the overheat cutoff circuit 2. Accordingly, the breakdown of the p channel trench gate type power MISFET 1 due to the overheat can be prevented. According to the p channel trench gate type power MISFET 1 with the overheat cutoff circuit 2 built therein from the above, reliability can be improved.

In FIG. 1, the overheat cutoff circuit 2 is explained by citing one using the gate cutoff resistor. The overheat cutoff circuit 2 that makes use of the gate cutoff resistor 3 has the gate cutoff resistor 3 and the protective MISFET 6 to turn off the p channel trench gate type power MISFET 1. Turing off the p channel trench gate type power MISFET 1 is realized by turning on the protective MISFET 6 to thereby allow the gate cutoff resistor 3 to cause a voltage drop and setting the voltage applied to the gate electrode of the p channel trench gate type power MISFET 1 to its threshold voltage or less. The voltage applied to the gate electrode of the p channel trench gate type power MISFET 1 is determined by the ratio of the gate cutoff resistor 3 and the on resistance of the protective MISFET 6. In this case, it is necessary that the on resistance of the protective MISFET 6 is sufficiently reduced as compared with the gate cutoff resistor 3 to set the voltage applied to the gate electrode of the p channel trench gate type power MISFET 1 to the threshold voltage or less (1V or less in general).

It is also necessary to set the value of the cutoff current to current drive capacity or less of an external drive circuit. This is because when the current greater than the current drive capacity is pulled in as the cutoff current, the output of the external drive circuit is reduced, so that the normal voltage cannot be outputted. The value of the cutoff current is substantially determined by the voltage (voltage applied to the gate pad) applied by the external drive circuit and the gate cutoff resistor 3.

Since the temperature detection circuit 4 and the like that constitute the overheat cutoff circuit 2 are supplied with the power supply from the gate pad as shown in FIG. 1, there is a fear that the overheat cutoff circuit 2 fails to operate in the normal manner due to external noise with variations in power-supply voltage or the like. For example, there is a possibility that such an oscillation phenomenon that cutoff and its release are repeated takes place, so that a normal cutting-off function will not be obtained. To avoid it, the gate cutoff resistor 3 formed in the overheat cutoff circuit 2 normally often makes use of a resistance greater than or equal to 5 kΩ. That is, it is necessary to use the gate cutoff resistor 3 of 5 kΩ or more for the purpose of preventing the oscillation phenomenon at the overheat cutoff circuit 2. On the other hand, when the resistance value of the gate cutoff resistor 3 is excessively increased, the switching speed of the p channel trench gate type power MISFET 1 becomes slow. Therefore, there is provided an upper limit to the resistance value of the gate cutoff resistor 3. From this point of view, a resistance ranging from 5 kΩ to 20 kΩ is often used as for the gate cutoff resistor 3 employed in the overheat cutoff circuit 2.

Meanwhile, an n channel power MISFET whose carriers are electrons, and a p channel power MISFET whose carriers are positive holes are known as power MISFETs. Both of these power MISFETs might be used as switching elements, for example. Here, such a configuration that a power MISFET used as a switching element is disposed on the source potential side rather than the load side is called "high side switch", whereas such a configuration that a power MISFET used as a switching element is disposed on the ground potential side rather than the load side is called "low side switch". The n channel power MISFET and the p channel power MISFET are used as the high side switches, for example. However, the constitution of the high side switch by the p channel power MISFET brings about an advantage in that a drive circuit can be simplified as compared with the configuration of the high side switch by the n channel power MISFET. This point will be explained.

Figure 2:
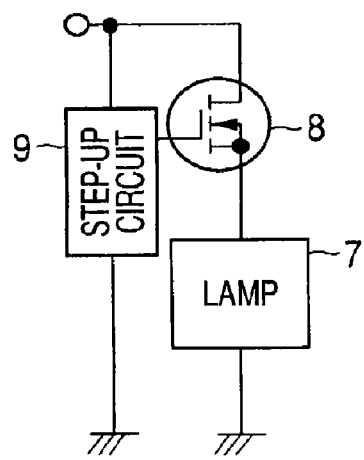
FIG. 2 is a circuit block diagram showing where an n channel power MISFET is used as a high side switch for lighting a lamp.

FIG. 2 is a circuit block diagram showing a case in which an n channel power MISFET is used as a high side switch for lighting a lamp (load), for example. As shown in FIG. 2, an n channel power MISFET 8 is provided on the source potential side of a lamp 7. A step-up circuit 9 for controlling switching of the n channel power MISFET 8 is connected to a gate electrode of the n channel power MISFET 8. Lighting/lighting-out of the lamp 7 can be performed by controlling on/off of the n channel power MISFET 8 by means of the step-up circuit 9.

When the n channel power MISFET 8 is used as the high side switch, it is necessary to apply a drive voltage ($V_G = V_{in}$ (input voltage)+$V_{GS}$ (threshold voltage)) higher than the input voltage to the gate electrode. Therefore, the step-up circuit 9 becomes necessary as shown in FIG. 2, and a drive circuit for driving the n channel power MISFET 8 becomes complex.

Figure 3:
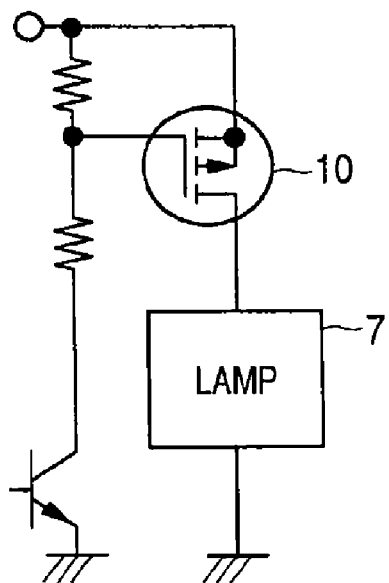
FIG. 3 is a circuit block diagram showing where a p channel power MISFET is used as a high side switch for lighting a lamp.

On the other hand, a circuit block diagram at the that the p channel power MISFET is used as a high side switch for lighting a lamp is shown in FIG. 3. As shown in FIG. 3, a p channel power MISFET 10 is provided on the source potential side of a lamp 7. A step-up circuit is not provided at the gate electrode of the p channel power MISFET 10. That is, since the p channel power MISFET 10 can be driven by a drive voltage ($V_G = V_{in}$ (input voltage)−$V_{GS}$ (threshold voltage)) lower than an input voltage when the p channel power MISFET 10 is used as the high side switch, a drive circuit for driving the p channel power MISFET 10 can be simplified. Thus, when the p channel power MISFET 10 is used as the high side switch as compared with the case in which the n channel power MISFET 8 is used as the high side switch, it can be said that it can realize a small-sized and simple system and is excellent in general versatility.

Even in the power MISFETs each having the overheat cutoff circuit built therein, there are known a product using the p channel power MISFET and a product using the n channel power MISFET. For the above-described reason, the p channel power MISFET with the overheat cutoff circuit built therein has superiority in terms of general versatility and is expected to meet requests from a wide range of customers.

It has heretofore been a common practice to use a planar type power MISFET as the power MISFET having the overheat cutoff circuit built therein. The planar type power MISFET has a structure in which a gate electrode is formed on a main surface of a semiconductor substrate. Since, however, it is difficult to reduce a cell size in the planar type power MISFET, there was a limit to a reduction in on resistance. Thus, it has been discussed that a trench type power MISFET is adopted instead of the conventional planar type power MISFET to shrink each cell, thereby reducing the on resistance as compared with the planar type power MISFET.

Figure 4:
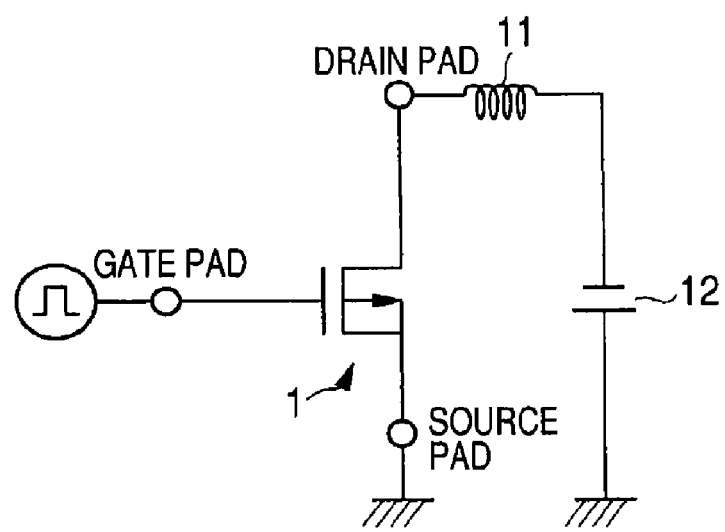
FIG. 4 is a diagram illustrating a circuit for measuring avalanche capability of a p channel trench gate type power MISFET.

Next, a description will be made of the avalanche capability of the p channel trench gate type power MISFET. The avalanche capability indicates an index of each element being not destroyed by avalanche breakdown. FIG. 4 is a diagram illustrating a circuit for measuring the avalanche capability of a p channel trench gate type power MISFET1. As shown in FIG. 4, an inductor 11 and a source or power supply 12 are connected to a drain pad of the p channel trench gate type power MISFET1. A source pad for the p channel trench gate type power MISFET1 and a terminal located on the side of being unconnected to the inductor 11 for the power supply 12 are grounded. A pulse generator is connected to a gate pad of the p channel trench gate type power MISFET. A description will be made of such a mechanism that the p channel trench gate type power MISFET will cause avalanche breakdown in the circuit configured in this way.

Figure 5:
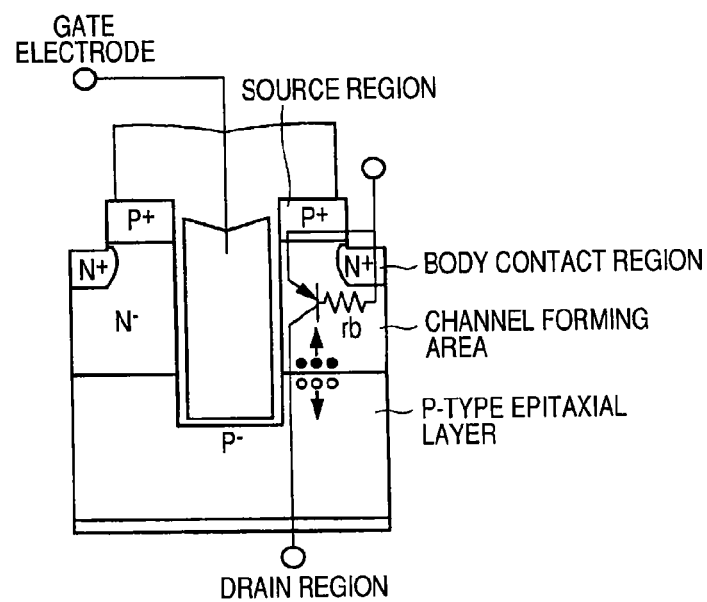
FIG. 5 is a typical diagram showing a p channel trench gate type power MISFET.

FIG. 5 is a typical diagram showing a p channel trench gate type power MISFET. In FIG. 5, a p-type semiconductor substrate (p⁻-type epitaxial layer) is formed as a drain region. A channel forming area (n⁻-type semiconductor region) corresponding to a body area is formed on the semiconductor substrate. A source region ($p^+$-type semiconductor region) is formed at the upper portion (surface) of the channel forming area. A gate electrode of a gate trench structure and a body contact region ($n^+$-type semiconductor region) are formed adjacent to the source region. When the p channel trench gate type power MISFET formed in this way is turned off, a gate voltage applied to the gate electrode reaches a threshold voltage or less. In doing so, a channel formed in the side surface of the gate electrode is lost to block or interrupt a current path, so that no drain current flows. At this time, a back-electromotive force occurs in a load having an inductance (L) and is applied to the drain region of the p channel trench gate type power MISFET.

Thus, a reverse bias voltage is applied to a pn junction formed in the boundary between the p-type semiconductor substrate and the channel forming area ($n^-$-type semiconductor region). When the reverse bias voltage exceeds a junction breakdown voltage of the pn junction, avalanche breakdown due to impact ionization occurs to produce a large amount of electron positive hole pairs.

On the other hand, the p channel trench gate type power MISFET is formed with a parasitic pnp bipolar transistor by a source region ($p^+$-type semiconductor region), a channel forming area ($n^-$-type semiconductor region) and a semiconductor substrate ($p^-$-type semiconductor region). Positive holes generated upon the occurrence of avalanche breakdown are injected into the corresponding drain region, and electrons are injected into the corresponding body contact region. Here, the channel forming area corresponds to a base region of the parasitic pnp bipolar transistor. When its base resistance is large, the parasitic pnp bipolar transistor is turned on. That is, when the value of a voltage drop (electron current×rb) developed across the base resistor exceeds about 0.7V, an emitter-to-base region is forward-biased so that the parasitic pnp bipolar transistor is turned on. In each cell in which such a parasitic pnp bipolar transistor is turned on, a large current uncontrollable by the gate electrode of the p channel trench gate type power MISFET flows, thereby generating heat. Since, at this time, the electrical resistance of the semiconductor region becomes small due to a rise in temperature by the generated heat, the positive feedback that a larger current flows takes place. As a result, the large current flows locally, thereby causing the breakdown of the p channel trench gate type power MISFET. This phenomenon is called "avalanche breakdown". In the automotive field in particular, there has been a demand for preventing the avalanche breakdown even though a load having large inductance exists. The avalanche capability becomes one important property.

In general, the p channel trench gate type power MISFET has the feature that it is hard to cause the avalanche breakdown as compared with the n channel trench gate type power MISFET. This is because the current amplification gain (hFE) of the pnp bipolar transistor parasitically existing in the p channel trench gate type power MISFET is much smaller than that of an npn bipolar transistor parasitically existing in the n channel trench gate type power MISFET. This is also because the mobility of positive holes corresponding to carriers of the p channel trench gate type power MISFET is smaller by about ¼ than the mobility of electrons corresponding to carriers of the n channel trench gate type power MISFET. Accordingly, it can be said that the shortage of avalanche capability becomes almost insignificant in the single p channel trench gate type power MISFET.

However, the p channel trench gate type power MISFET with the overheat cutoff circuit built therein presents a problem that the avalanche capability does not attain to a target value. The reason why the avalanche capability does not attain thereto will be discussed below.

Figure 6:
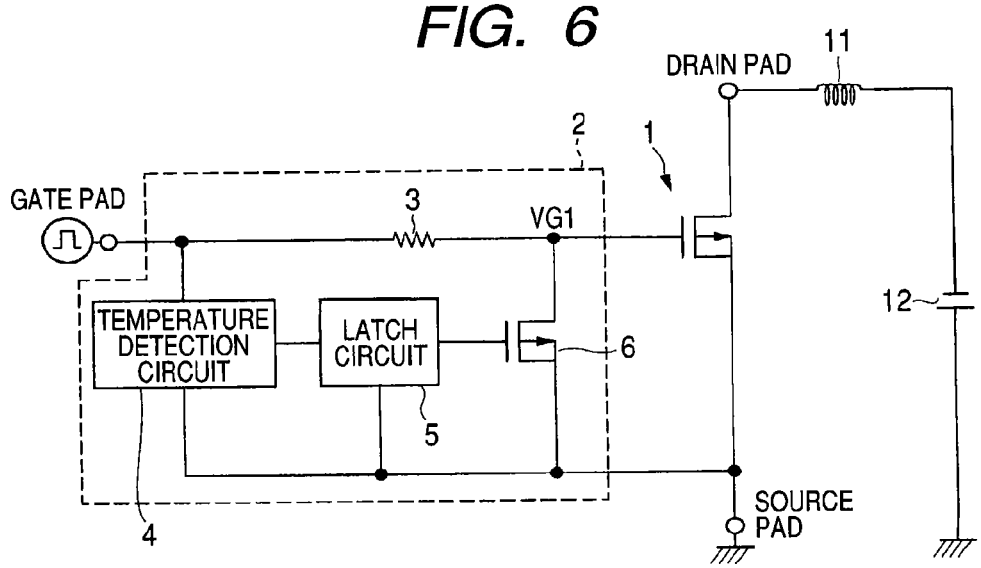
FIG. 6 is a diagram illustrating a circuit for measuring avalanche capability of a p channel trench gate type power MISFET with an overheat cutoff circuit built therein.
Figure 7:
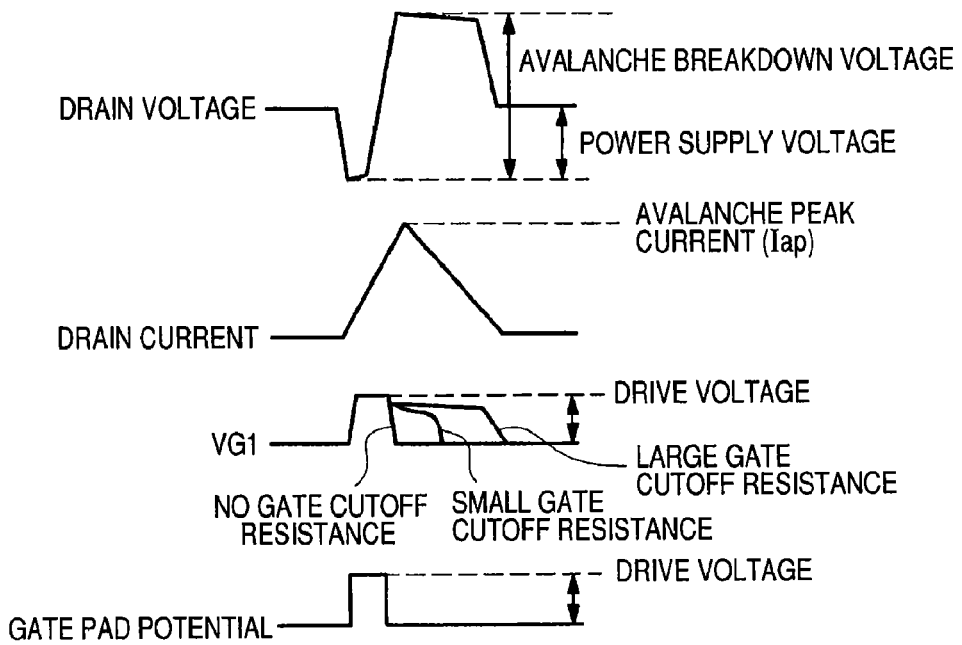
FIG. 7 is a diagram showing switching waveforms at the time that the avalanche capability is measured with a circuit configuration shown in FIG. 6.

FIG. 6 is a diagram illustrating a circuit for measuring the avalanche capability of a p channel trench gate type power MISFET1 with an overheat cutoff circuit built therein. FIG. 6 is basically similar in configuration to FIG. 4 and is different therefrom in that an overheat cutoff circuit 2 is connected to the p channel trench gate type power MISFET1. Switching waveforms at the time that the avalanche capability is measured with such a circuit configuration as shown in FIG. 6, are illustrated in FIG. 7. Incidentally, since FIG. 7 is targeted to the p channel trench gate type power MISFET1, the vertical axis represents the plus and minus with being reversed. When a drive voltage is applied to its corresponding gate pad in FIG. 7, a drain current flows through the p channel trench gate type power MISFET1. At this time, the voltage similar to the drive voltage applied to the gate pad is applied even as to the potential of a region VG1 existing between a gate cutoff resistor 3 included in the overheat cutoff circuit 2 shown in FIG. 6 and a gate electrode of the p channel trench gate type power MISFET1.

Subsequently, when the potential of the gate pad is changed from the drive voltage to an off voltage, a back-electromotive force due to an inductance (L load) occurs and avalanche breakdown occurs in the p channel trench gate type power MISFET1. Therefore, an avalanche breakdown voltage is applied to a drain pad so that an avalanche peak current (Tap) flows as the drain current. It has been revealed that when the gate cutoff resistor 3 does not exist at this time, the potential of the region VG1 is also brought to off normally in a manner similar to the potential of the gate pad, whereas when a large gate cutoff resistor 3 exists, the state in which the voltage of a drive voltage level is being applied to the region VG1 continues long. Since a large current flows through the easy-to-turn on p channel trench gate type power MISFET1 in a concentrated manner while the large voltage remains applied to the drain pad and source pad in this state, heat is generated so that the p channel trench gate type power MISFET1 is destroyed. This phenomenon appears pronouncedly as the resistance value of the gate cutoff resistor 3 series-connected to the corresponding gate electrode of the p channel trench gate type power MISFST1 becomes larger.

This phenomenon is considered to appear for the following reasons. That is, it is considered that in the p channel trench gate type power MISFET1 with the overheat cutoff circuit 2 built therein, the unexpected large gate current flows upon avalanche breakdown based on the inductance (L load), so that a voltage drop is developed across the gate cutoff resistor (5 kΩ to 20 kΩ) 3 series-connected to the gate electrode. Since the gate electrode is negatively biased at this time, the p channel trench gate type power MISFET1 can lead to a turned-on state. Since a large current concentratedly flows through each cell low in on resistance in this state while a large voltage remains applied between the source and drain regions, heat is generated and hence the p channel trench gate type power MISFET1 is brought to destruction or breakdown due to thermal runaway beyond an area of safe operation (so-called ASO destruction or breakdown). The phenomenon that the p channel trench gate type power MISFET1 leads to the ASO breakdown upon the normal avalanche capability measuring test in this way is a destruction or breakdown phenomenon which does not appear in the single p channel trench gate type power MISFET1 and is developed only when the large gate cutoff resistor 3 peculiar to the overheat cutoff circuit 2 exists.

It is now considered that since the overheat cutoff circuit 2 is built, the overheat cutoff circuit 2 may operate when the p channel trench gate type power MISFET1 generates heat. However, the phenomenon now in question is of an avalanche breakdown phenomenon that appears when the p channel trench gate type power MISFET1 is turned off. That is, it is a problem at the time that the off voltage is applied to the gate electrode rather than the drive voltage. The forcible turning-off of the p channel trench gate type power MISFET1 by the overheat cutoff circuit 2 will count for nothing.

Thus, it is understood that the problem that the p channel trench gate type power MISFET1 leads to the ASO breakdown due to the existence of the gate cutoff resistor exists. The above-described problem occurs in the p channel trench gate type power MISFET with the overheat cutoff circuit built therein, whereas the p channel planar type power MISFET with the overheat cutoff circuit built therein has high avalanche capability without causing such a problem. This difference will be explained.

Figure 8:
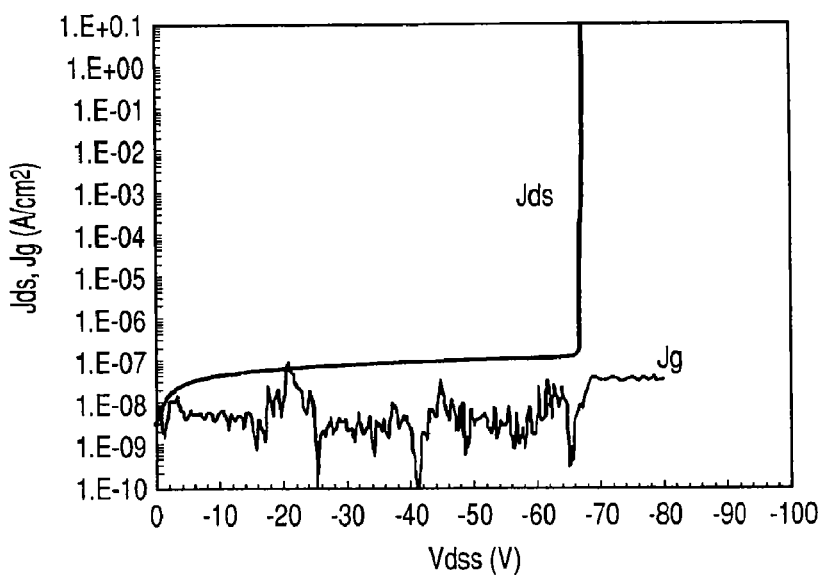
FIG. 8 is a graph showing relationships between a breakdown voltage between a source region and a drain region and a drain current density and between the breakdown voltage and a gate current density in a p channel planar type power MISFET.

FIG. 8 is a graph showing relationships between a breakdown voltage (Vdss) between a source region and a drain region and a drain current density (Jds) and between the breakdown voltage (Vdss) and a gate current density (Jg) in a p channel planar type power MISFET. The horizontal axis indicates the breakdown voltage (V), and the vertical axis indicates the drain current density (Jds) and the gate current density (Jg).

It is understood that when the breakdown voltage exceeds −65V as shown in FIG. 8, avalanche breakdown occurs in the p channel planar type power MISFET, so that a drain current rises sharply. It is however understood that a gate current does not increase as shown in FIG. 8 even though the avalanche breakdown occurs in the p channel planar type power MISFET. Thus, since the gate current does not increase in the p channel planar type power MISFET even though the gate cutoff resistor exists, a voltage drop expressed in the form of the gate cutoff resistor×the gate current is reduced. Therefore, the phenomenon that the ASO breakdown is reached is not developed even though the gate cutoff resistor exists.

Figure 9:
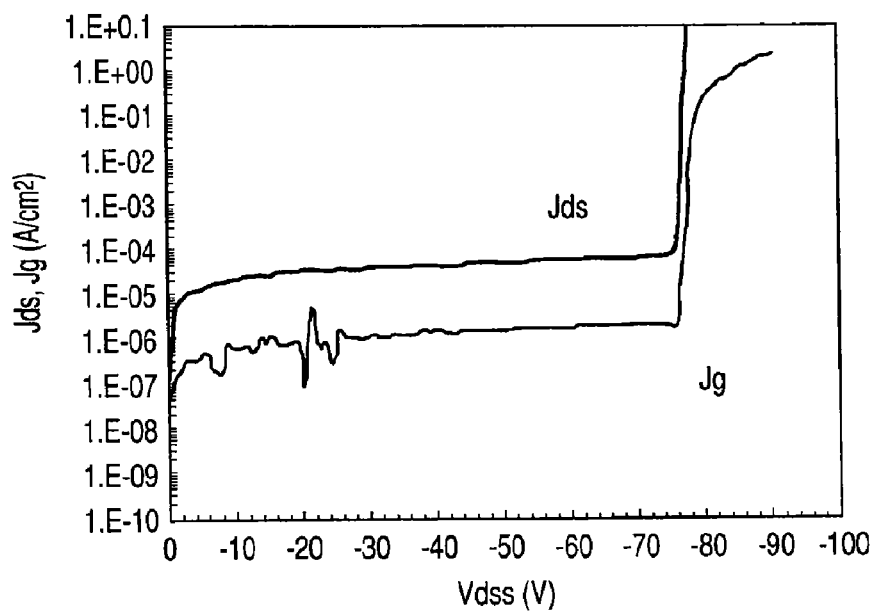
FIG. 9 is a graph showing relationships between a breakdown voltage between a source region and a drain region and a drain current density and between the breakdown voltage and a gate current density in a p channel trench gate type power MISFET.

On the other hand, FIG. 9 is a graph showing relationships between a breakdown voltage (Vdss) between a source region and a drain region and a drain current density (Jds) and between the breakdown voltage (Vdss) and a gate current density (Jg) in a p channel trench gate type power MISFET. The horizontal axis indicates the breakdown voltage (V), and the vertical axis indicates the drain current density (Jds) and the gate current density (Jg).

It is understood that when the breakdown voltage exceeds −75V as shown in FIG. 9, avalanche breakdown occurs in the p channel trench gate type power MISFET, so that a drain current rises suddenly. It is understood that a gate current also increases remarkably in the p channel trench gate type power MISFET unlike the p channel planar type power MISFET. This means that carriers (electrons) generated upon the avalanche breakdown have been injected into the gate electrode. Thus, since the gate current increases in the p channel trench gate type power MISFET, a voltage drop expressed in the form of the gate cutoff resistor×the gate current becomes larger. Since this voltage drop serves in the direction in which a negative bias is applied to the gate electrode, the p channel trench gate type power MISFET can be brought into a state in which a voltage similar to a drive voltage is applied to its gate electrode despite the p channel trench gate type power MISFET is being turned off. From this point of view, the phenomenon that since a large current concentratedly flows through the easy-to-turn on p channel trench gate type power MISFET1 while a large voltage remains applied between the source and drain regions, heat is generated and hence the p channel trench gate type power MISFET1 is brought to ASO breakdown due to thermal runaway beyond the area of safe operation, becomes manifest. This phenomenon is considered to be a phenomenon that does not appear in the p channel planar type power MISFET and is peculiar to the p channel trench gate type power MISFET.

The reason why the gate current is reduced upon the avalanche breakdown in the p channel planar type power MISFET, whereas the gate current increases upon the avalanche breakdown in the p channel trench gate type power MISFET, will next be examined from the viewpoint of their structures.

Figure 10:
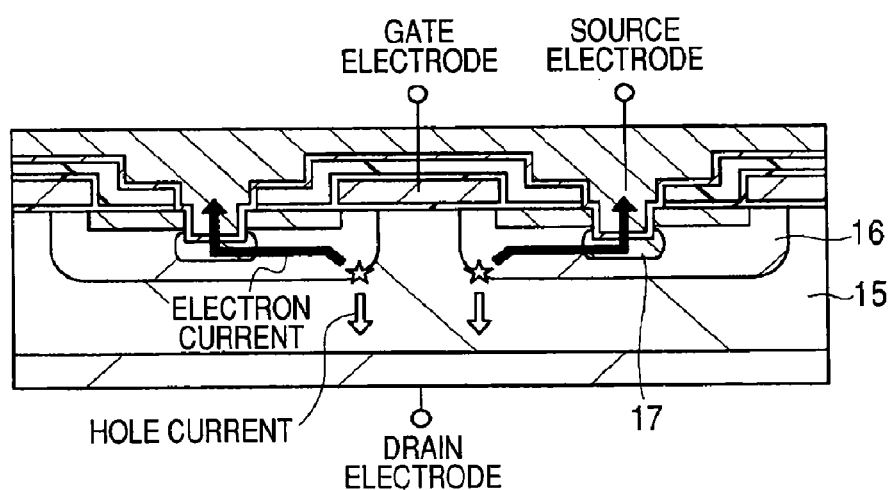
FIG. 10 is a sectional view illustrating a sectional structure of a p channel planar type power MISFET.

FIG. 10 is a sectional view of a p channel planar type power MISFET. In FIG. 10, the maximum point of electric field at avalanche breakdown is represented by each asterisk. As you can see in FIG. 10, it is understood that the maximum point of electric field exists in a region large in curvature, of a boundary region (pn junction region) between a p$^-$-type epitaxial layer 15 and a channel forming area (n$^-$-type semiconductor region) 16. Impact ionization is easy to occur in the maximum point of electric field, and a large amount of electron positive hole pairs are formed with such impact ionization. The generated positive holes flow into the drain region, whereas electrons are injected into a body contact region (n$^+$-type semiconductor region) 17 through the channel forming area 16. In the p channel planar type power MISFET at this time, the distance between the formed position of its gate electrode and the maximum point of electric field easy to cause impact ionization is increased, and a generated electron current also flows through a position spaced away from the gate electrode. Therefore, very few are capable of injecting the electrons produced upon the avalanche breakdown into the gate electrode, and the phenomenon that the ASO breakdown is reached is not developed even though the gate cutoff resistor exists.

Figure 11:
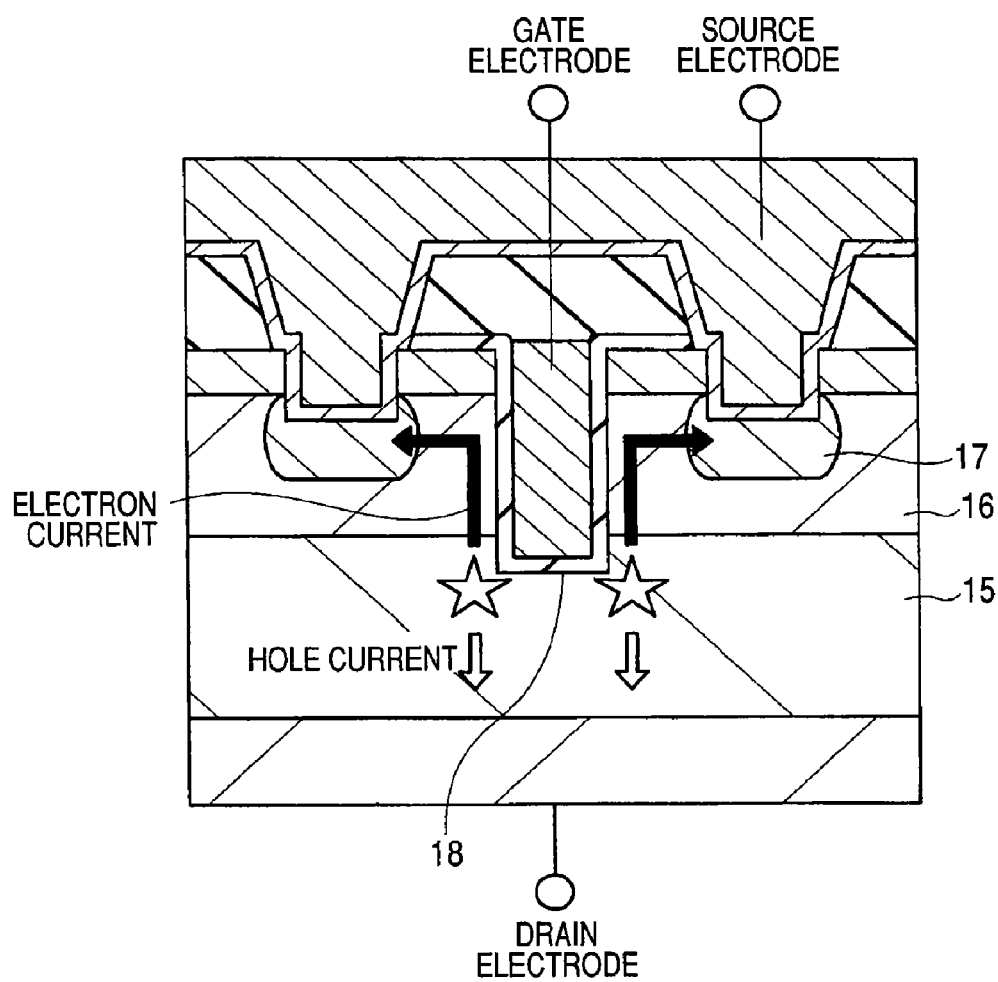
FIG. 11 is a sectional view depicting a sectional structure of a p channel trench gate type power MISFET.

On the other hand, FIG. 11 is a sectional view of a p channel trench gate type power MISFET. Even in FIG. 11, the maximum point of electric field at avalanche breakdown is represented by each asterisk. As you can see in FIG. 11, it is understood that the maximum point of electric field exists in the neighborhood of the bottom of a trench 18 where a gate electrode is formed. It is thus understood that the p channel trench gate type power MISFET takes a structure in which the distance between the maximum point of electric field and the gate electrode is very short. While electron positive hole pairs occur due to impact ionization generated in the neighborhood of the maximum point of electric field, an electron current flows along each sidewall of the trench 18 in the p channel trench gate type power MISFET. That is, positive holes flow from a p$^-$-type epitaxial layer 15 to a drain region, whereas electrons flow from a channel forming area (n$^-$-type semiconductor region) 16 to a body contact region (n$^+$-type semiconductor region) 17 along the sidewalls of the trench 18 where the gate electrode is formed. It is understood that paying attention to the path of each electron generated upon the avalanche breakdown, the p channel trench gate type power MISFET takes a structure in which the electrons generated upon the avalanche breakdown are easy to be injected into the gate electrode, as compared with the p channel planar type power MISFET. From this point of view, the p channel trench gate type power MISFET has a high risk of the electrons generated upon the avalanche breakdown being injected into the gate electrode. Further, the phenomenon that since a large current concentratedly flows in the easy-to-turn on p channel trench gate type power MISFET1 due to the existence of a gate cutoff resistor while a large voltage remains applied between the source and drain regions, heat is generated thereat and the p channel trench gate type power MIS- FET1 leads to ASO breakdown due to thermal runaway beyond the area of safe operation, becomes manifest.

It is understood here that since the electrons are reduced by one digit as compared with the positive holes, the energy necessary to overcome the potential of a gate insulating film is easy to present a problem at the p channel trench gate type power MISFET rather than the n channel trench gate type power MISFET.

All the above are summarized as follows: In the p channel trench gate type power MISFET with the overheat cutoff circuit built therein, the electrons generated by the avalanche breakdown at its turning-off are injected into the gate electrodes. Then, the current based on the injected electrons flows through the gate cutoff resistor to cause the voltage drop. With this voltage drop, the p channel trench gate type power MISFET supposed to be turned off becomes easy to turn on. In doing so, the large current concentratedly flows through the easy-to-turn on p channel trench gate type power MISFET1 while the large voltage remains applied between the source region and the drain region. Therefore, the p channel trench gate type power MISFET1 generates heat and leads to ASO breakdown due to thermal runaway beyond the area of safe operation.

There is a need to prevent the occurrence of the voltage drop developed across the gate cutoff resistor for the purpose of solving this problem. It is necessary that since the voltage drop is determined according to the product of the gate current and the gate cutoff resistor, the gate current or the gate cutoff resistor is reduced as low as possible to reduce the voltage drop.

Firstly, the resistance value of the gate cutoff resistor is considered low. Since, however, the oscillation phenomenon that the cut-off or interruption of the overheat cutoff circuit and its release are repeated cannot be suppressed when the gate cutoff resistor is lowered, it is difficult to reduce the gate cutoff resistor.

Thus, secondly, there is considered a method for reducing electrons injected into the gate electrode upon avalanche breakdown. That is, it is a method for reducing the gate current. If the quantity of electrons injected into the gate electrode can be reduced by this method, then the p channel trench gate type power MISFET can be prevented from ASO breakdown.

In the p channel trench gate type power MISFET, the electric field concentrates on the bottom of the trench formed with the gate electrode upon avalanche breakdown. The impact ionization occurs at the bottom of the trench on which the electric field concentrates, and the electron positive hole pairs occur. And the electrons generated due to the impact ionization flow into the body contact region by way of each sidewall of the trench. It is considered from this result that in order to suppress the injection of the electrons in the gate electrode upon avalanche breakdown, the electric field at the bottom of the trench is relaxed and the current path is formed in other place to reduce the amount of electron current flowing through each sidewall of the trench.

Figure 12:
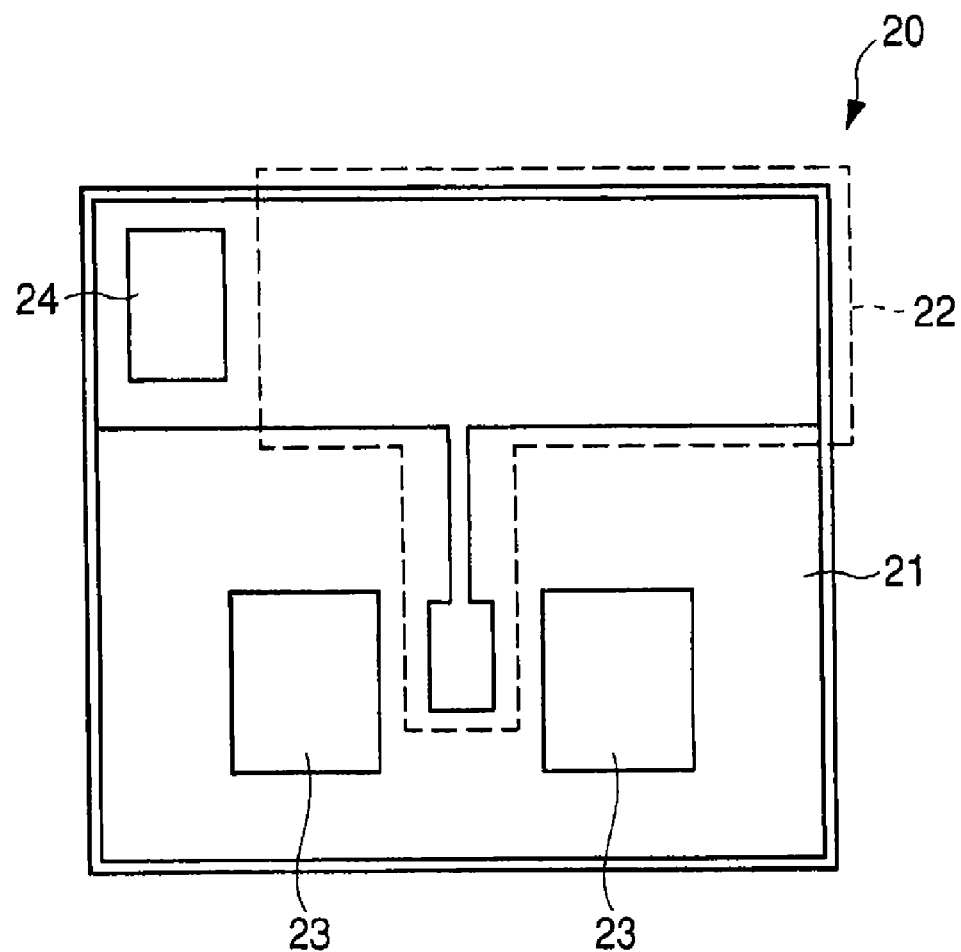
FIG. 12 is a plan view typically showing a semiconductor chip in which a semiconductor device according to the first embodiment is formed.

The structure of the semiconductor device having realized this method will be explained below. FIG. 12 is a plan view typically showing a semiconductor chip 20 formed with the semiconductor device according to the first embodiment. A power MISFET forming area 21 and an overheat cutoff circuit forming area 22 are formed in the semiconductor chip 20. The p channel trench gate type power MISFET according to the first embodiment is formed in the power MISFET forming area 21 in s plural fashion. The respective p channel trench gate type power MISFETs form cells. On the other hand, an overheat cutoff circuit is formed in the overheat cutoff circuit forming area 22. Described specifically, a gate cutoff resistor and a protective MISFET constituted of a polysilicon film are formed therein.

A source pad 23 and a gate pad 24 are formed in the surface of the semiconductor chip 20. The source pad 23 and the gate pad 24 are external connecting terminals. The source pad 23 is connected to a source region of each p channel trench gate type power MISFET. The gate pad 24 is connected to its corresponding gate electrode of the p channel trench gate type power MISFET. Although not illustrated in FIG. 12, a drain pad is formed in the back surface of the semiconductor chip 20. The drain pad is connected to its corresponding drain region of the p channel trench gate type power MISFET. Incidentally, no external connecting terminals are connected to the overheat cutoff circuit. That is, it can be said that the overheat cutoff circuit is built in the p channel trench gate type power MISFET. It is thus understood that the p channel trench gate type power MISFET and the overheat cutoff circuit are formed in the same semiconductor chip 20.

Figure 13:
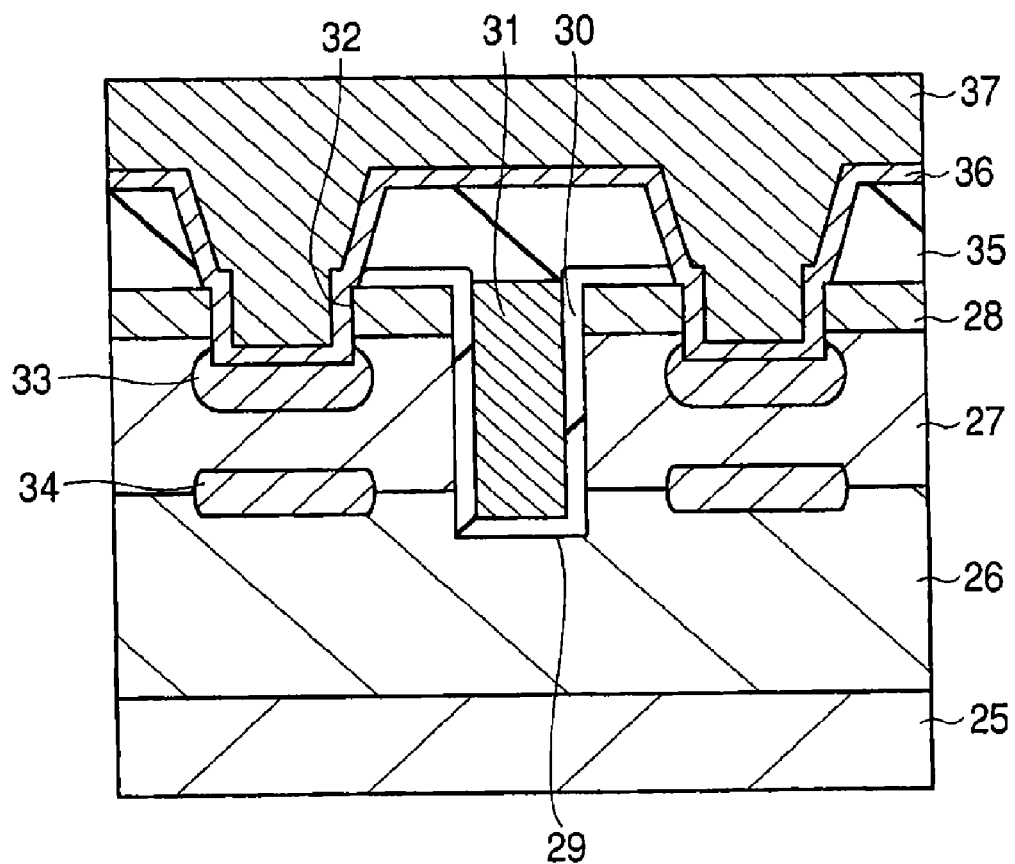
FIG. 13 is a sectional view illustrating a sectional structure of a p channel trench gate type power MISFET.

Next, FIG. 13 is a sectional view illustrating a sectional structure of a p channel trench gate type power MISFET. In FIG. 13, a $p^-$-type epitaxial layer 26 is formed over a semiconductor substrate 25 comprising p-type monocrystalline silicon. The semiconductor substrate 25 and the $p^-$-type epitaxial layer 26 result in a drain region of the p channel trench gate type power MISFET.

A channel forming area 27 constituted of an $n^-$-type semiconductor region is formed over the $p^-$-type epitaxial layer 26. A source region 28 constituted of a $p^+$-type semiconductor region is formed over the channel forming area 27. A trench 29 is formed which extends through the channel forming area 27 from the upper surface of the source region 28 and reaches the interior of the $p^-$-type epitaxial layer 26. A gate insulating film 30 is formed over the inner wall of the trench 29. A gate electrode 31 is formed over the gate insulating film 30 and so as to bury the trench 29. The gate electrode 31 is connected to a gate pad through a gate cutoff resistor by a lead wiring.

Body contact trenches 32 are formed on the lateral sides of the trench 29 buried by the gate electrode 31 with the source region 28 interposed therebetween. A body contact region (first n-type semiconductor region) 33 constituted of an $n^+$-type semiconductor region is formed at the bottom of each body contact trench 32. The body contact region 33 is formed in order to reduce base resistance of a parasitic bipolar transistor with the source region 28 as an emitter region, the channel forming area 27 as a base region and the $p^-$-type epitaxial layer 26 as a collector region. Incidentally, although the body contact trenches 32 are formed and the body contact regions 33 are provided at the bottoms of the body contact trenches 32 in FIG. 13, each body contact region 33 may be formed at substantially the same height as the source region 28. That is, although the first embodiment takes such a structure that the position of the upper surface of the body contact region 33 is placed below the bottom of the source region 28 by forming each body contact trench 32, the body contact region 33 may be formed at substantially the same height as the source region 28 without forming each body contact trench 32.

An insulating film 35 is formed over the source regions 28 and the gate electrode 31. A barrier conductive film 36 is formed over the insulating film 35 and in an area containing the inner walls of the body contact trenches 32. A wiring 37 is formed over the barrier conductive film 36. The wiring 37 is electrically connected to both of the source regions 28 and the body contact regions 33. Thus, the source regions 28 and the body contact regions 33 are set to the same potential. This is done to suppress the turning on of the parasitic bipolar transistor by the occurrence of a potential difference between each source region 28 and its corresponding body contact region 33. This wiring 37 is connected to a source pad formed in the surface of the semiconductor chip.

Next, each n-type semiconductor region (second n-type semiconductor region) 34 is formed at a portion below the body contact region 33. One feature of the present invention is that the n-type semiconductor regions 34 are provided. Each of the n-type semiconductor regions 34 is disposed in a region deeper than the body contact region 33 and shallower than the bottom of the trench 29. The n-type semiconductor region 34 is set so as to be higher in impurity concentration than the channel forming area 27 and lower in impurity concentration than the body contact region 33.

Figure 14:
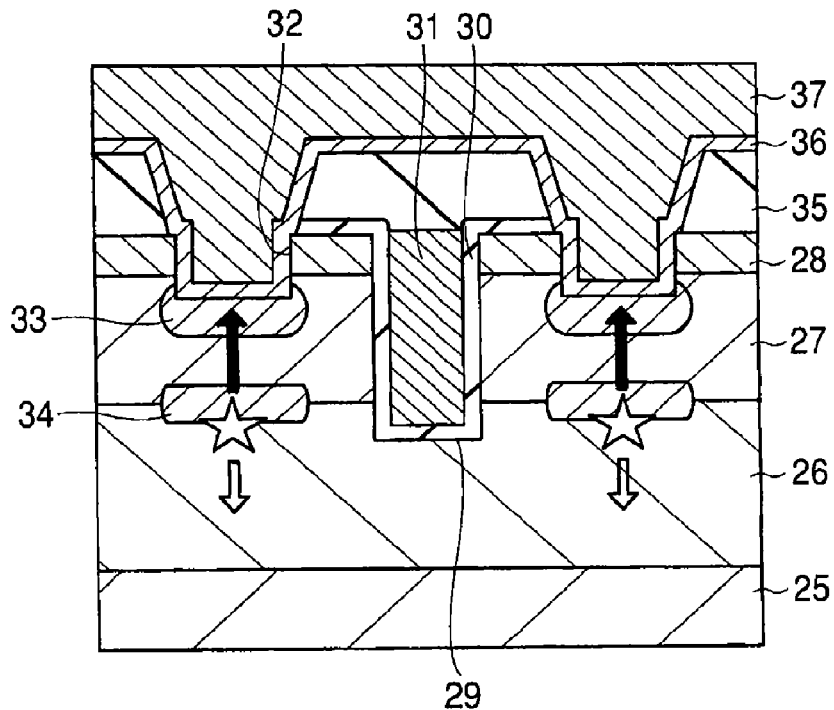
FIG. 14 is a sectional view showing avalanche breakdown points of the p channel trench gate type power MISFET according to the first embodiment.

The impurity concentration of the n-type semiconductor region 34 is set higher than that of the channel forming area 27 to change an impurity concentration distribution near the trench 29, thereby making it possible to reduce the concentration of an electric field on the bottom of the trench 29. As shown in FIG. 14, an avalanche breakdown point can be shifted to a junction boundary (pn junction) between the n-type semiconductor region 34 placed at a position spaced away from near the bottom of the trench 29 and the p$^-$-type epitaxial layer 26. It is, therefore, possible to suppress the flowing of an electron current generated upon avalanche breakdown through each sidewall of the trench 29. As a result, the injection of electrons into the gate electrode 31 can be reduced. Accordingly, it is possible to prevent a voltage drop developed across the gate cutoff resistor series-connected to the gate electrode 31 and to prevent the p channel trench gate type power MISFET supposed to be turned off from thermal breakdown by its turning-on beyond the area of safe operation. That is, one feature of the present invention is that each n-type semiconductor region 34 higher in impurity concentration than the channel forming area 27 is disposed between the body contact region 33 and the bottom of the trench 29 thereby to intentionally cause avalanche breakdown in the area spaced away from the neighborhood of the bottom of the trench 29. Since the avalanche breakdown is easy to occur as a high-concentration pn junction region is reached, the n-type semiconductor region 34 needs to be set higher in impurity concentration than the channel forming area 27 from the viewpoint that the avalanche breakdown point is intentionally changed.

On the other hand, when the impurity concentration of the n-type semiconductor region 34 is high, a breakdown voltage (BVdss) between the source region 28 and the drain region (p$^-$-type epitaxial layer 26) is lowered. Therefore, it is not desirable to excessively set high the impurity concentration from the viewpoint that the breakdown voltage is ensured. A problem also arises in that when the impurity concentration of each n-type semiconductor region 34 is made excessively high, many defects occur. Thus, in the first embodiment, the impurity concentration of the n-type semiconductor region 34 is set higher than that of the channel forming area 27 to change the avalanche breakdown point intentionally, whereas the impurity concentration thereof is set lower than that of the body contact region 33 to ensure the breakdown voltage.

A description will next be made of which position is specifically most suitable for the formation of the n-type semiconductor region 34, although each n-type semiconductor region 34 is formed deeper than the body contact region 33 and formed in the area shallower than the bottom of the trench 29 thereby to change the avalanche breakdown.

Figure 15:
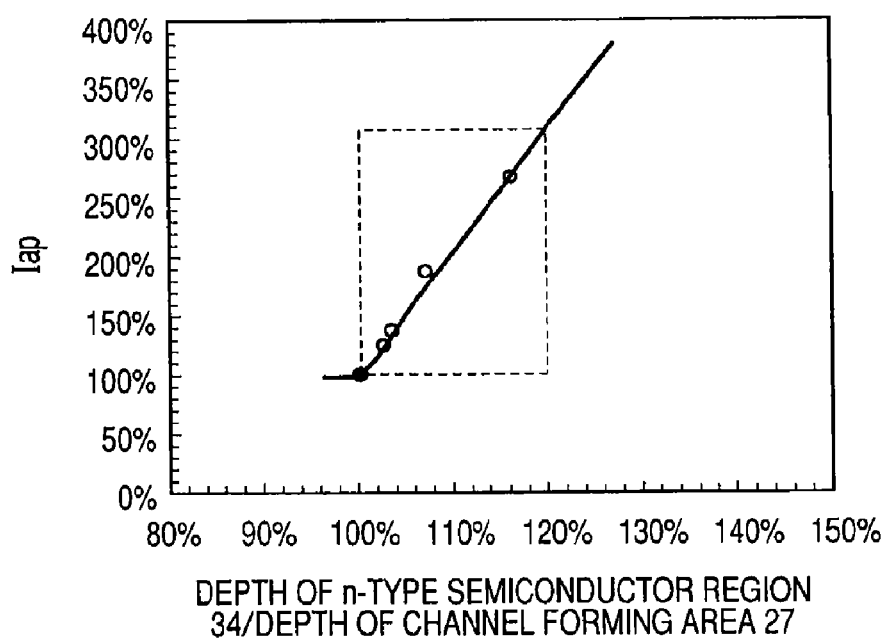
FIG. 15 is a graph illustrating a relationship between the rate of the depth of an n-type semiconductor region to the depth of a channel forming area and an avalanche peak current.

FIG. 15 is a graph illustrating a relationship between the rate (depth of n-type semiconductor region 34/depth of channel forming area 27) of the depth of the n-type semiconductor region 34 to the depth of the channel forming area 27 and an avalanche peak current (Iap). The horizontal axis expresses the depth of the n-type semiconductor region 34 to the depth of the channel forming area 27 in % with the depth of the channel forming area 27 as 100%. When, for example, the depth of the n-type semiconductor region 34 is shallower than that of the channel forming area 27, the scale of the horizontal axis reaches 100% or less. When the depth of the n-type semiconductor region 34 is deeper than that of the channel forming area 27, the scale of the horizontal axis reaches 100% or more. Here, as is understood through FIG. 13, for example, the depth of the channel forming area 27 indicates the depth from the upper surface of the source region 28 to the bottom (boundary between the channel forming area 27 and the p$^-$-type epitaxial layer 26) of the channel forming area 27 with the upper surface of the source region 28 as the reference. Similarly, the depth of the n-type semiconductor region 34 indicates the depth from the upper surface of the source region 28 to the bottom of the n-type semiconductor region 34. The vertical axis indicates the avalanche peak current (Iap). An avalanche peak current at the time that the depth of the n-type semiconductor region 34 is made identical to that of the channel forming area 27, is assumed to be 100%. An avalanche peak current at the time that the depth of the n-type semiconductor region 34 is changed therefrom, is expressed in relative representation from 100%.

It is understood that as shown in FIG. 15, the avalanche peak current also increases as the depth of the n-type semiconductor region 34 becomes deeper. That is, it is understood that the more the depth of the n-type semiconductor region 34 is formed in the area deeper than the depth of the channel forming area 27, the more the avalanche capability can be increased.

Figure 16:
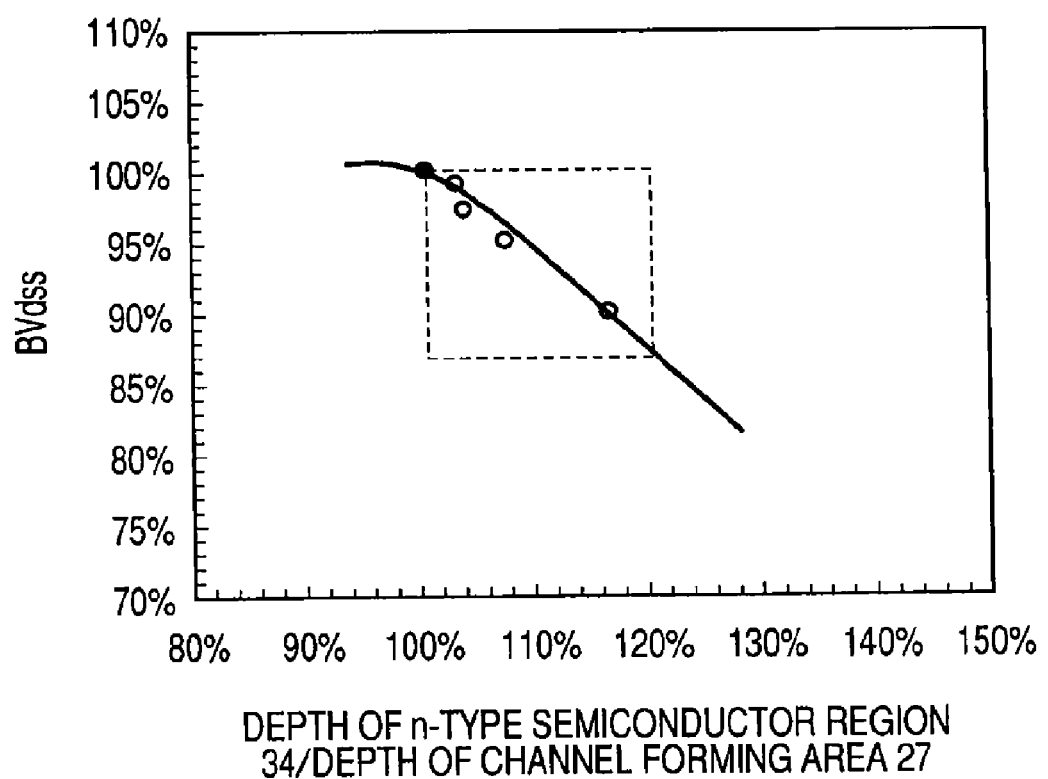
FIG. 16 is a graph showing a relationship between the ratio of the depth of an n-type semiconductor region to the depth of a channel forming area and a breakdown voltage.

On the other hand, FIG. 16 is a graph showing a relationship between the ratio (depth of n-type semiconductor region 34/depth of channel forming area 27) of the depth of the n-type semiconductor region 34 to the depth of the channel forming area 27 and a breakdown voltage (BVdss). The horizontal axis expresses the depth of the n-type semiconductor region 34 to the depth of the channel forming area 27 in % with the depth of the channel forming area 27 as 100%. The vertical axis indicates the breakdown voltage (BVdss) between the source region 28 and the drain region. A breakdown voltage at the time that the depth of the n-type semiconductor region 34 is made identical to that of the channel forming area 27, is assumed to be 100%. A breakdown voltage at the time that the depth of the n-type semiconductor region 34 is changed therefrom, is expressed in relative representation from 100%.

It is understood that as shown in FIG. 16, the breakdown voltage is reduced as the depth of the n-type semiconductor region 34 becomes deeper. That is, it is understood that the more the depth of the n-type semiconductor region 34 is formed in the area deeper than the depth of the channel forming area 27, the more the breakdown voltage is lowered.

From the above description, the deeper the depth of the n-type semiconductor region 34 than the depth of the channel forming region 27, the more desirable its depth is, from the viewpoint of enhancing the avalanche capability, whereas it is desirable that the depth of the n-type semiconductor region 34 is not made deeper than that of the channel forming area 27 from the viewpoint of no reducing a breakdown voltage. That is, the avalanche capability and the breakdown voltage are placed in a relationship of trade-off with respect to the depth of the n-type semiconductor region 34. It is thus desirable that from the viewpoint of enhancing the avalanche capability and suppressing a reduction in breakdown voltage, the depth of the n-type semiconductor region 34 is set to be larger than 100% (one times) and smaller than 120% (1.2 times). When the depth of the n-type semiconductor region 34 is set to 120% with respect to the depth of the channel forming area 27 as shown in FIGS. 15 and 16, for example, the avalanche peak current (Iap) can be set to 300% and the breakdown voltage (BVdss) can be set to 90%.

The semiconductor device according to the first embodiment is constituted as mentioned above. The operation thereof will be explained below. The p channel trench gate type power MISFET shown in FIG. 13 is brought to a state in which the difference in potential is being produced between the drain region and the source region 28 formed in the p-type semiconductor substrate 25 (including even p⁻-type epitaxial layer 26). Then, a negative voltage is applied to the gate electrode 31 from the state in which the gate electrode 31 is grounded and placed in a non-operated state. When the negative voltage is applied to the gate electrode 31, positive holes existing in the channel forming area 27 are collected or gathered at the side surface of the trench 29 constituting the gate electrode 31, and hence the channel forming area 27 in the neighborhood of the side surface of the trench 29 is inverted to a p type semiconductor region. The p-type semiconductor region formed by this inversion results in a channel corresponding to the path of each positive hole. The source region and the semiconductor substrate 25 (drain region) are coupled to each other by this channel, so that the positive holes flow between the source region and the drain region. Thus, current flows in the direction of thickness of the semiconductor substrate 10 (in the vertical direction) to turn on the p channel trench gate type power MISFET. Subsequently, when the gate electrode 31 is brought to a state in which a ground voltage has been applied thereto from the negative voltage, the channel formed at the side surface of the trench 29 disappears. Therefore, the source region and the drain region are electrically disconnected so that the power MISFET is turned off. By repeating this sequence of operations, the p channel trench gate type power MISFET is on/off-operated. Thus, the power MISFET can be used as a switch by controlling the voltage applied to the gate electrode 31.

The operation of the p channel trench gate type power MISFET at the time that it is turned off will be described in detail. Assuming that a load including an inductance is connected to the p channel trench gate type power MISFET, for example, a back-electromotive force occurs in the load having the inductance (L), and the generated back-electromotive force is applied to the drain region of the p channel trench gate type power MISFET.

Thus, a reverse bias voltage is applied to a pn junction formed in the boundary between the p⁻-type epitaxial layer 26 and the channel forming area (n⁻-type semiconductor region). When the reverse bias voltage exceeds a junction breakdown voltage of the pn junction, avalanche breakdown due to impact ionization occurs to produce a large amount of electron positive hole pairs. Since the n-type semiconductor region 34 higher in impurity concentration than the channel forming area 27 is formed in the first embodiment, the avalanche breakdown due to the impact ionization occurs in the neighborhood of the n-type semiconductor region 34 as shown in FIG. 14. That is, the avalanche breakdown occurs in the area spaced away from the bottom of the trench 29.

The positive holes of the electron positive hole pairs generated by the avalanche breakdown flow into the drain region side. On the other hand, the electrons flow from the n-type semiconductor region 34 to the body contact region 33 via the channel forming area 27. Since, at this time, the avalanche breakdown point is away from the trench 29, the electron current flows without passing through the neighborhood of each sidewall of the trench 29. Therefore, the injection of the electrons into the gate electrode 31 via the gate insulating film 30 can be reduced.

Thus, since the gate current can be reduced, it is possible to prevent a voltage drop developed across the gate cutoff resistor series-connected to the gate electrode 31 and prevent the p channel trench gate type power MISFET supposed to be turned off, from being brought to thermal breakdown beyond the area of safe operation by its turning-on. Thus, according to the first embodiment, the reliability of the p channel trench gate type power MISFET with the overheat cutoff circuit built therein can be enhanced.

The technique executed in the first embodiment to form the high concentration semiconductor region directly below the body contact region using the same impurity as the impurity contained in the channel forming area is a technique used even in the improvement of avalanche capability of a single n channel trench gate type power MISFET. This is however completely different from the first embodiment in effect and function. This point of view will be explained.

A description will first be made of the single n channel trench gate type power MISFET. In the single n channel trench gate type power MISFET, a p-type high-concentration semiconductor region of the same conduction type as the channel forming area (p type) is formed directly below its corresponding body contact region (p type). Thus, the maximum point of electric field is designed so as to be directly below the body contact region as viewed from the trench bottom, and impact ionization is caused to occur in this region. As a result, when a pn junction existing in the boundary between the channel forming area and the drain region (n type) is brought to avalanche breakdown, a positive hole current generated due to the avalanche breakdown flows from the p-type high-concentration semiconductor region to the body contact region located directly thereabove.

It can be said that this shows a state in which the positive hole current flows through a resistance-low path in the shortest distance. That is, it can be said that this shows a state in which the base resistance of a parasitic npn bipolar transistor is set as low as possible. Therefore, the parasitic npn bipolar transistor is hard to turn on and the n channel trench gate type power MISFET is hard to cause avalanche breakdown. This technique is used in the n channel trench gate type power MISFET easy to cause the avalanche breakdown.

Consider where this technology is applied to the single p channel trench gate type power MISFET. Since the p channel trench gate type power MISFET is hard to cause the avalanche breakdown as compared with the n channel trench gate type power MISFET, it can be said that the necessity of taking such a structure that an n-type high-concentration semiconductor region of the same conduction type as a channel forming area (n type) is formed directly below its corresponding body contact region (n type), does not occur so much.

On the other hand, let's consider a p channel trench gate type power MISFET with an overheat cutoff circuit built therein. In this case, an n-type high-concentration semiconductor region of the same conduction type as a channel forming area (n type) is formed directly below its corresponding body contact region (n type). Thus, the maximum point of electric field is designed so as to be directly below the body contact region from the trench bottom, and impact ionization is caused to occur in this region. As a result, when a pn junction existing in the boundary between the channel forming area and a drain region (p type) is brought to avalanche breakdown, an electron current generated due to the avalanche breakdown flows from the n-type high-concentration semiconductor region to the body contact region provided directly thereabove.

This acts so as to suppress the flowing of the electron current through the neighborhood of each sidewall of the trench and reduce electrons injected into a gate electrode. Reducing the electrons injected into the gate electrode enables prevention of a voltage drop developed across a gate cutoff resistor series-connected to the gate electrode. As a result, it is possible to suppress the phenomenon that the p channel trench gate type power MISFET is turned on while a large voltage remains applied between the drain and source regions, and to prevent the p channel trench gate type power MISFET from leading to breakdown or destruction beyond the area of safe operation.

It is understood that while such a configuration that the p-type high-concentration semiconductor region of the same conduction type as the channel forming area is formed directly below the body contact region is common between the single n channel trench gate type power MISFET and the p channel trench gate type power MISFET with the overheat cutoff circuit built therein in this manner, they are respectively different in effect and function from each other. That is, the single n channel trench gate type power MISFET is effected for the purpose of reducing the base resistance of the parasitic npn bipolar transistor, whereas the p channel trench gate type power MISFET with the overheat cutoff circuit built therein is effected for the purpose of preventing the injection of the electrons into the gate electrode.

Thus, although there is known the technique for forming the p-type high-concentration semiconductor region of the same conduction type as the channel forming area directly below the body contact region in the single n channel trench gate type power MISFET, it does not describe the problem peculiar to the p channel trench gate type power MISFET with the overheat cutoff circuit built therein, which has been found out by the present inventors. In view of this point, the idea itself as to the point that a noticeable effect can be attained in that it is possible to avoid the injection of electrons into the gate electrode and thereby prevent the p channel trench gate type power MISFET with the overheat cutoff circuit built therein from leading to breakdown beyond the area of safe operation, does not exist. This noticeable effect is peculiar to the p channel trench gate type power MISFET with the overheat cutoff circuit built therein. It is not considered that this is one at which a person skilled in the art could have easily arrived from the technique based on the single n channel trench gate type power MISFET.

A method for manufacturing the semiconductor device according to the first embodiment will next be explained with reference to the accompanying drawings. FIGS. 17 through 31 are respectively sectional views typically showing the process of manufacturing the semiconductor device. A p channel trench gate type power MISFET forming area, an overheat cutoff circuit forming area, and a boundary area between the p channel trench gate type power MISFET and the overheat cutoff circuit forming area are shown in the respective drawings.

Figure 17:
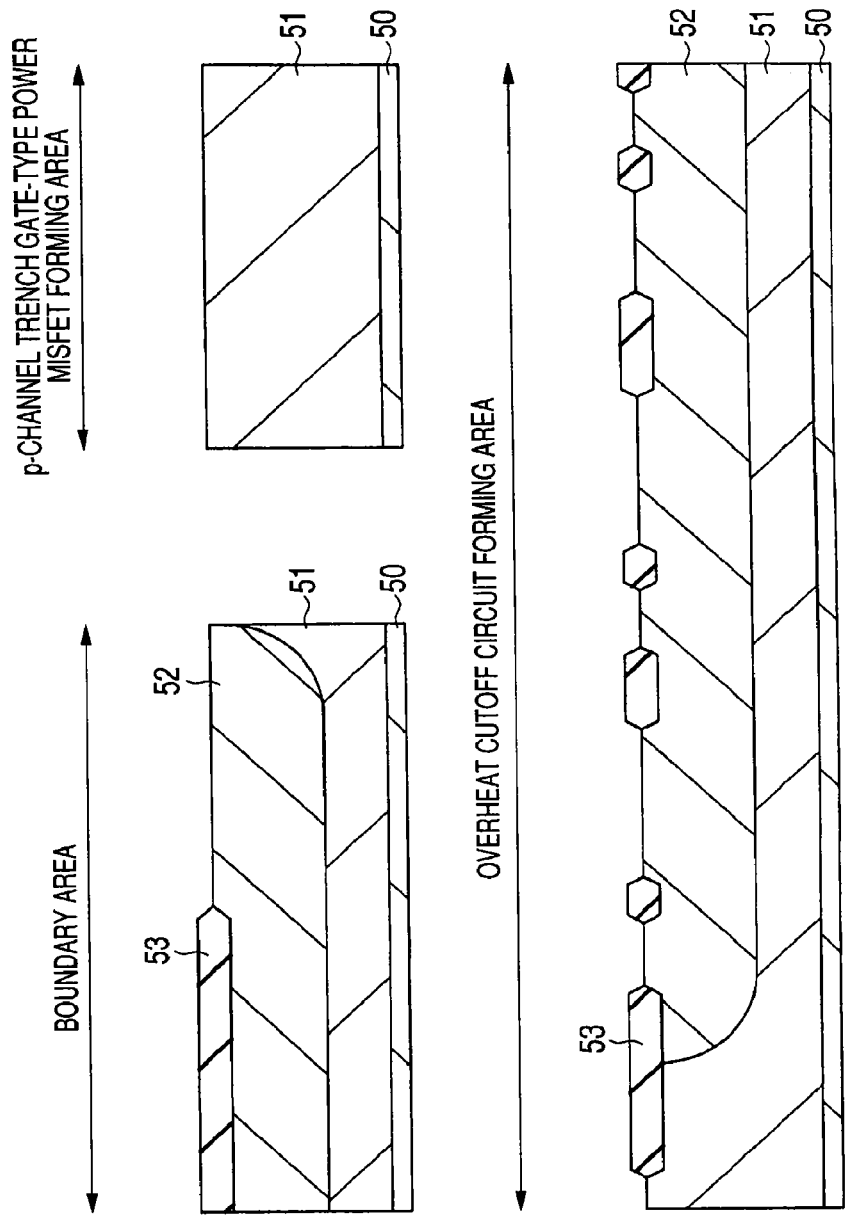
FIG. 17 is a sectional view illustrating a process of manufacturing the semiconductor device according to the first embodiment.

As shown in FIG. 17, a semiconductor wafer is first prepared in which a p-type impurity is introduced onto a p-type semiconductor substrate 50 to form a p⁻-type epitaxial layer 51. Then, a silicon oxide film (not shown) is formed in the surface (main surface) of the p⁻-type epitaxial layer 51 by using a thermal oxidation method. Thereafter, a silicon nitride film (not shown) is formed in the entire surface of the p⁻-type epitaxial layer 51. Next, the silicon nitride film is patterned using photolithography technology and etching technology. The patterning is done in such a manner that the silicon nitride film does not remain in an area in which each device isolation region is formed. Subsequently, a resist film is applied onto the silicon nitride film subjected to the patterning and thereafter the resist film is patterned using photolithography technology. The patterning is done in such a manner that well forming regions are made open. For example, phosphorus and arsenic or the like are introduced into the p⁻-type epitaxial layer 51 by an ion implantation method with the patterned resist film as a mask to form an n-type well 52. After the impurities have been introduced by the ion implantation method, heat treatment or annealing is executed to activate the impurities. The n-type well 52 is formed in the overheat cutoff circuit forming area and the boundary area. Thereafter, the resist film subjected to the patterning is removed. With the patterned silicon nitride film as a mask, a silicon oxide film is formed by the thermal oxidation method and thereafter the silicon nitride film subjected to the patterning is removed, thereby forming each device isolation region 53. The device isolation regions 53 are formed in the overheat cutoff circuit forming area and the boundary area.

Figure 18:
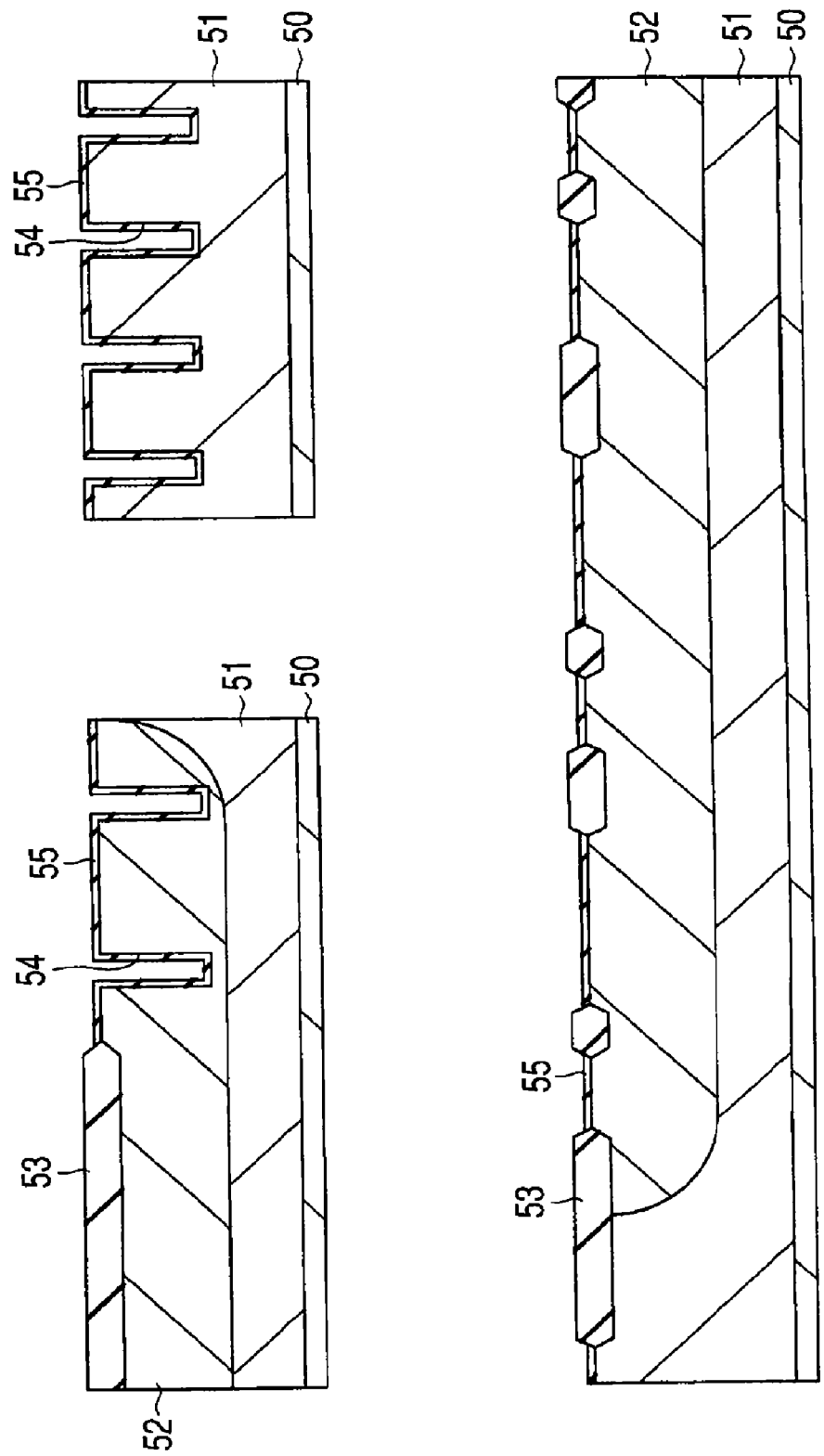
FIG. 18 is a sectional view following FIG. 17, showing the semiconductor device manufacturing process.

Trenches 54 are formed or defined in the p⁻-type epitaxial layer 51 by using photolithography technology and etching technology as shown in FIG. 18. The trenches 54 are formed in the p channel trench gate type power MISFET and the boundary area. A gate insulating film 55 is formed over the semiconductor substrate 50 including the bottoms and sidewalls of the trenches 54. The gate insulating film 55 is used as a gate insulting film of the p channel trench gate type power MISFET.

The gate insulating film 55 is formed of, for example, a silicon oxide film. The gate insulating film 55 can be formed using, for example, the thermal oxidation method. However, the gate insulating film 55 is not limited to the silicon oxide film but can be changed in various ways. The gate insulating film 55 may be formed as a silicon oxynitride film (SiON), for example. That is, such a structure that nitrogen is segregated in the interface between the gate insulting film 55 and the semiconductor substrate 50 may be taken. The silicon oxynitride film brings about high effects to suppress the occurrence of an interfacial level in the film and reduce an electron trap as compared with the silicon oxide film. It is thus possible to enhance hot carrier resistance of the gate insulating film 55 and improve insulation resistance. The silicon oxynitride film is hard to cause the impurity to penetrate therethrough as compared with the silicon oxide film. Therefore, the use of the silicon oxynitride film in the gate insulating film 55 makes it possible to suppress a variation in threshold voltage due to the diffusion of impurities in a gate electrode into the semiconductor substrate 50 side. Upon forming the silicon oxynitride film, for example, the semiconductor substrate 50 may be heat-treated or annealed in an atmosphere containing nitrogen such as NO, $NO_2$ or $NH_3$. Similar effects can be brought about even though after the gate insulating film 55 constituted of the silicon oxide film is formed in the surface of the semiconductor substrate 50, the semiconductor substrate 50 is heat-treated in an atmosphere containing nitrogen to segregate nitrogen in the interface between the gate insulating film 55 and the semiconductor substrate 50.

The gate insulating film 55 may be formed of, for example, a high-permittivity film higher in dielectric constant than the silicon oxide film. The silicon oxide film has heretofore been used as the gate insulating film 55 from the viewpoint that it is high in insulation resistance and excellent in terms of electrical/physical stability of silicon-silicon oxide interface and the like. There has however been a demand for extra-thinning of the thickness of the gate insulating film 55 with device micro-fabrication. When the silicon oxide film thin in this way is used as the gate insulating film 55, a so-called tunnel current occurs in which electrons flowing through a channel of each MISFET tunnel a barrier formed by the silicon oxide film and flows through the gate electrode.

Therefore, a high-dielectric film has been used which is capable of increasing its physical thickness by using a material higher in dielectric constant than the silicon oxide film even in the case of the same capacity. According to the high-dielectric film, a leakage current can be reduced because the physical film thickness can be increased even though they are made identical in capacity.

For example, a hafnium oxide film ($HfO_2$ film) corresponding to one of hafnium oxides is used as the high-dielectric film. However, other hafnium insulating films such as a hafnium aluminate film, HfON film (hafnium oxynitride film), HfSiO film (hafnium silicate film), HfSiON film (hafnium silicon oxynitride film) and HfAlO film can be used instead of the hafnium oxide film. Further, a hafnium insulating film obtained by introducing oxides such as tantalum oxide, niobium oxide, titanium oxide, zirconium oxide, lanthanum oxide, yttrium oxide, etc. into theses hafnium insulating films can also be used. Since the hafnium insulating film is higher in permittivity than the silicon oxide film and the silicon oxynitride film in a manner similar to the hafnium oxide film, effects similar to those obtained where the hafnium oxide film is used can be obtained.

Figure 19:
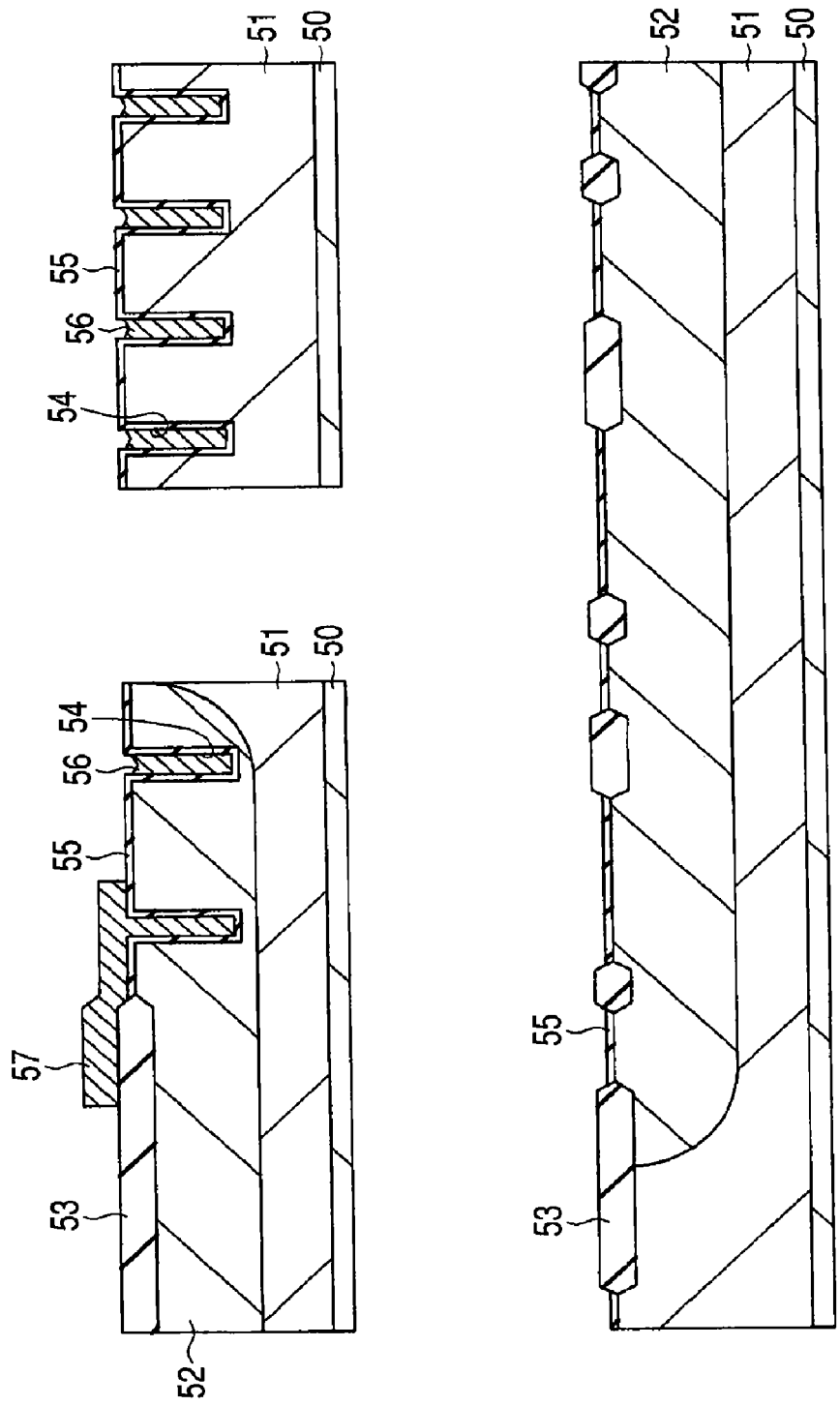
FIG. 19 is a sectional view following FIG. 18, showing the semiconductor device manufacturing process.

Subsequently, as shown in FIG. 19, a polysilicon film in which a p-type impurity (e.g. boron) has been introduced, is formed over the semiconductor substrate 50 containing the interiors of the trenches 54. The polysilicon film can be formed using, for example, a CVD (Chemical Vapor Deposition) method and is formed so as to bury the interior of each trench 54. After the polysilicon film has been formed over the semiconductor substrate 50 containing the interiors of the trenches 54, a p-type impurity may be introduced into the polysilicon film using the ion implantation method.

Next, the polysilicon film is subjected to patterning by using photolithography technology and etching technology. With this patterning, the polysilicon film formed over the semiconductor substrate 50 is removed in the p channel trench gate type power MISFET forming area, and the polysilicon film is left behind only within the trenches 54, whereby gate electrodes 56 embedded into the trenches 54 can be formed. A gate lead-out electrode 57 is formed in the boundary area. The gate lead-out electrode 57 is electrically connected to the corresponding gate electrode 56.

Figure 20:
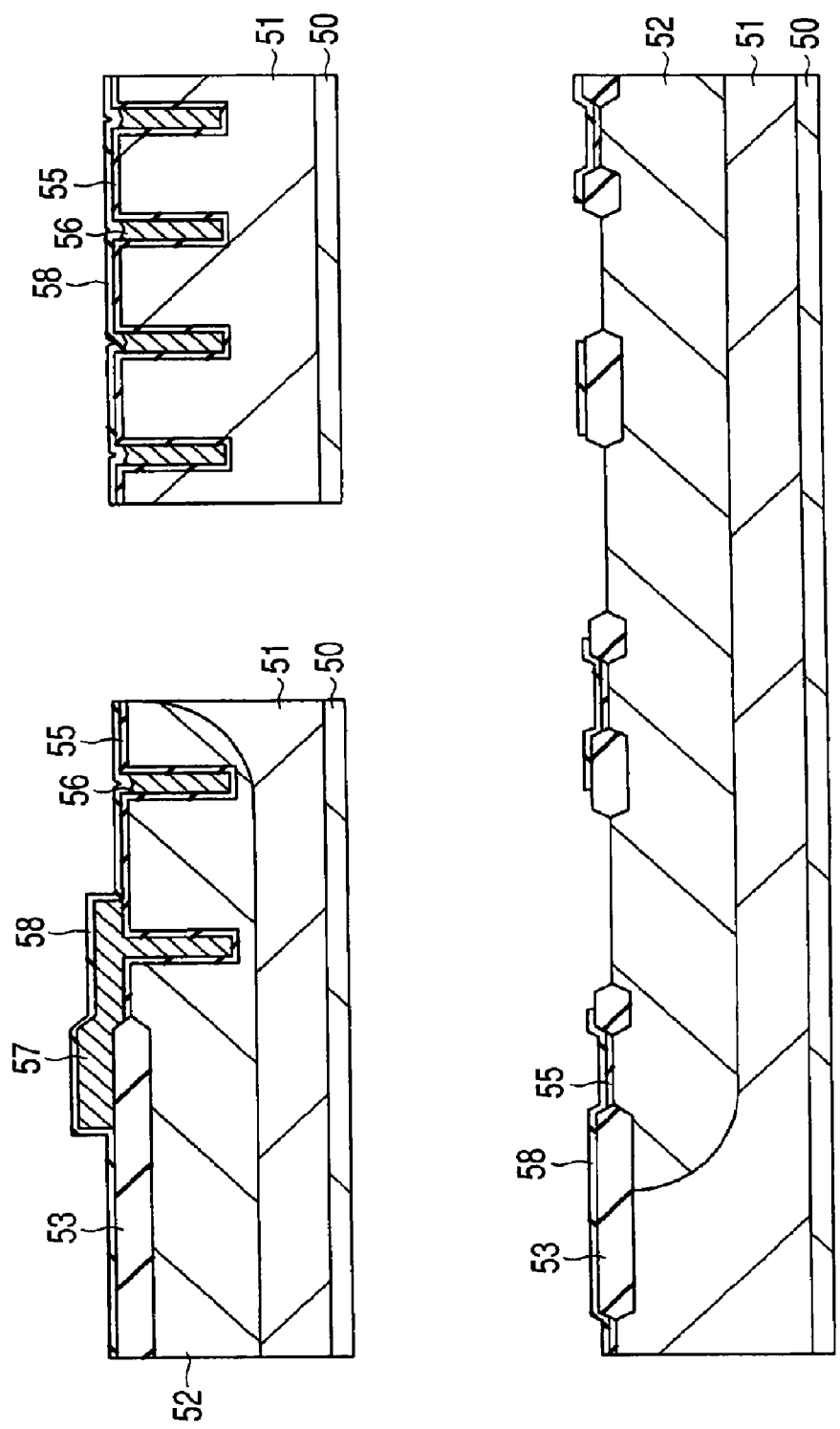
FIG. 20 is a sectional view following FIG. 19, showing the semiconductor device manufacturing process.

Subsequently, as shown in FIG. 20, a silicon oxide film 58 is formed over the semiconductor substrate 50 by using the CVD method, for example. The silicon oxide film 58 is subjected to patterning by using photolithography technology and etching technology. The patterning is done so as to open a channel forming area of each MISFET (including protective MISFET) formed in the overheat cutoff circuit forming area. The gate insulating film 55 formed in a layer below the silicon oxide film 58 is also removed in the channel forming area. Then, a threshold-voltage (Vth) adjusting impurity is introduced into the opened channel forming area by using photolithography technology and the ion implantation method.

Figure 21:
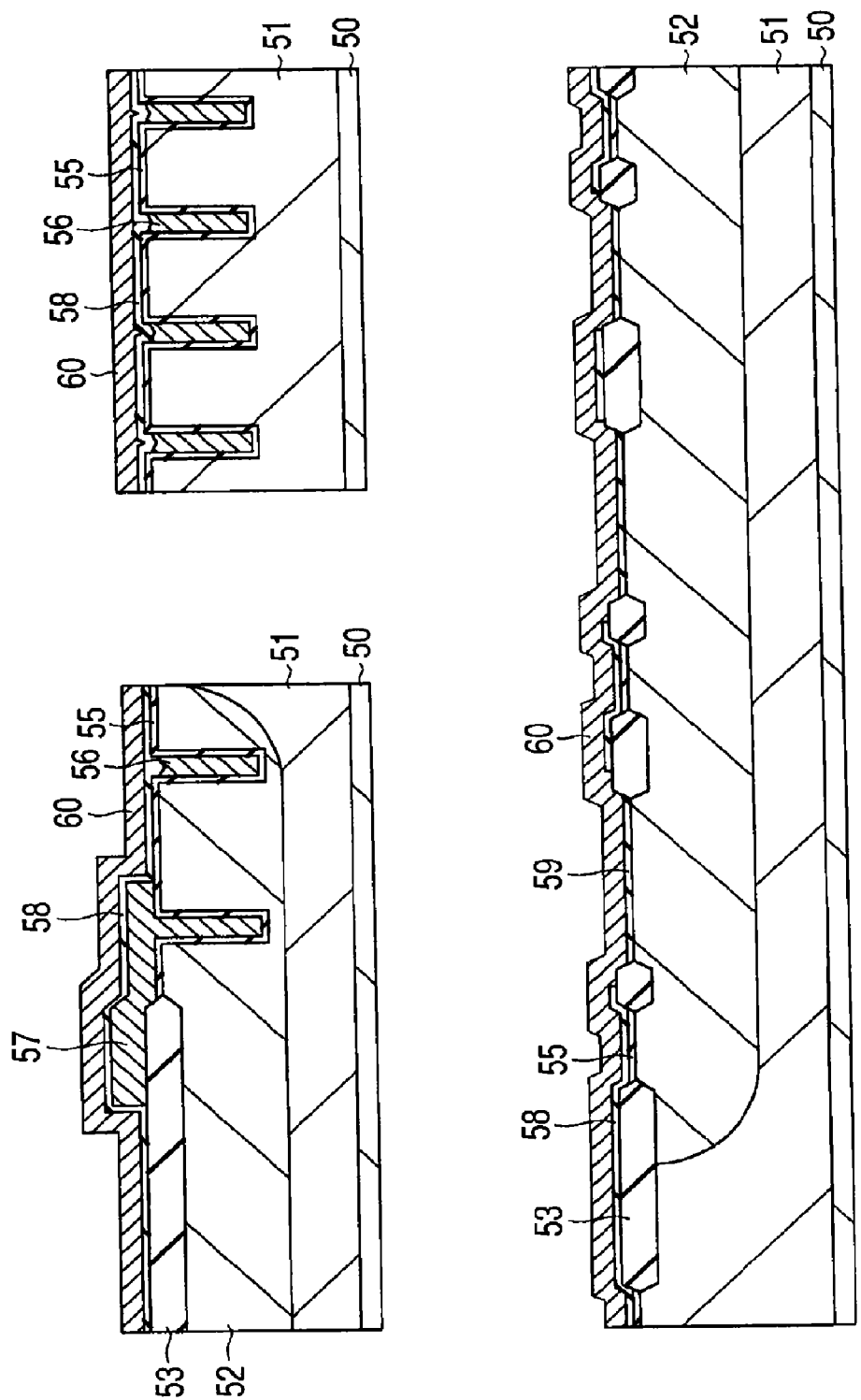
FIG. 21 is a sectional view following FIG. 20, showing the semiconductor device manufacturing process.

Next, as shown in FIG. 21, a gate insulating film 59 is formed over the channel forming area of the MISFET in the overheat cutoff circuit forming area by using photolithography technology and etching technology. The gate insulting film 59 becomes a gate insulating film of each MISFET formed in the overheat cutoff circuit forming area. In a manner similar to the gate insulting film 55 of the p channel trench gate type power MISFET referred to above, the gate insulating film 59 may be formed of the silicon oxide film, silicon oxynitride film or high-dielectric film.

Figure 22:
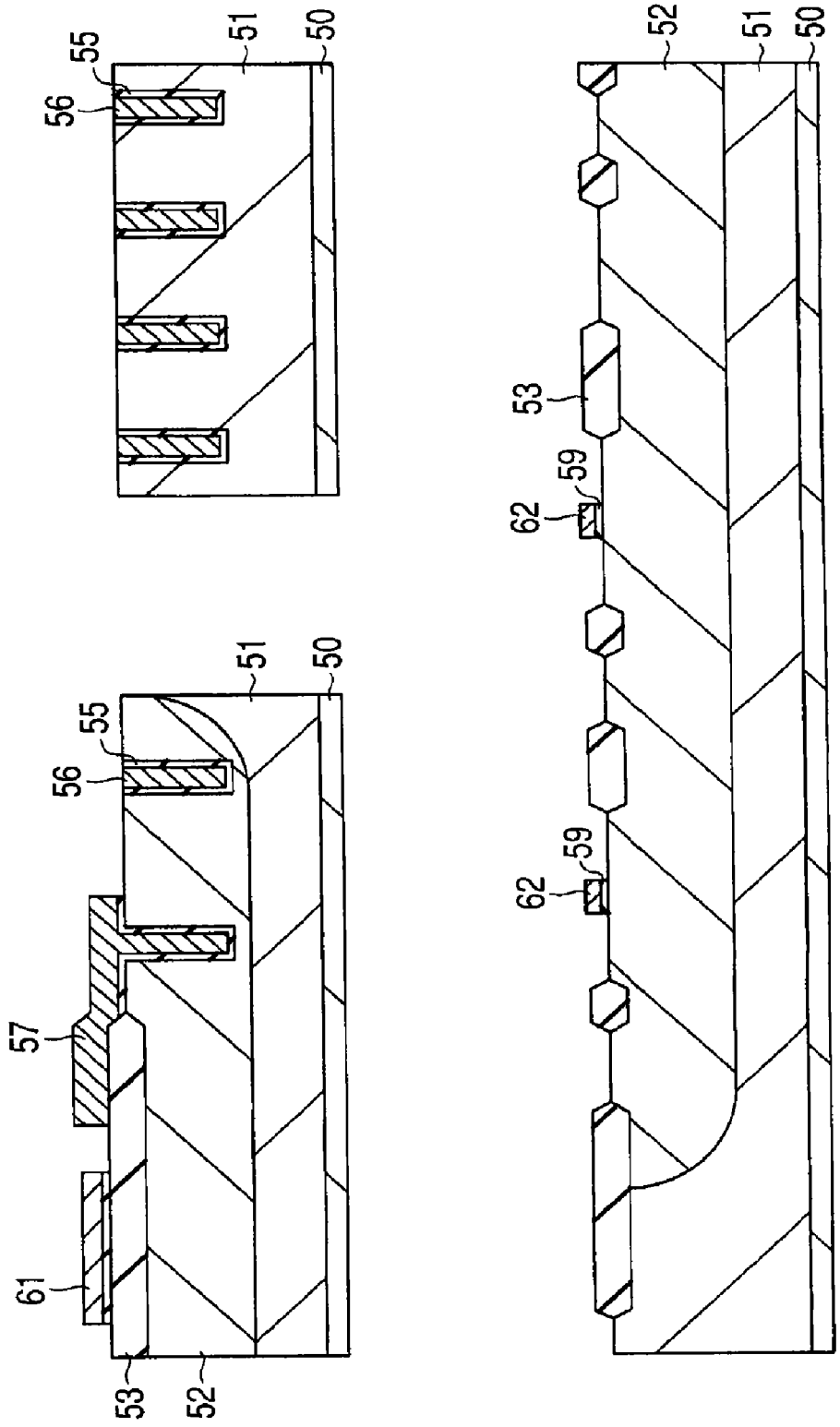
FIG. 22 is a sectional view following FIG. 21, showing the semiconductor device manufacturing process.

Subsequently, a polysilicon film 60 is formed over the semiconductor substrate 50. A p-type impurity is introduced into a partial region of the polysilicon film 60 by using photolithography technology and the ion implantation method. The partial region corresponds to a gate electrode forming area of each MISFET formed in the overheat cutoff circuit forming area. As shown in FIG. 22, the polysilicon film 60 is subjected to patterning by using photolithography technology and etching technology. Thus, a polysilicon resistive element 61 of 5 kΩ to 20 kΩ can be formed in the boundary area. Gate electrodes 62 can be formed in the overheat cutoff circuit forming area.

Figure 23:
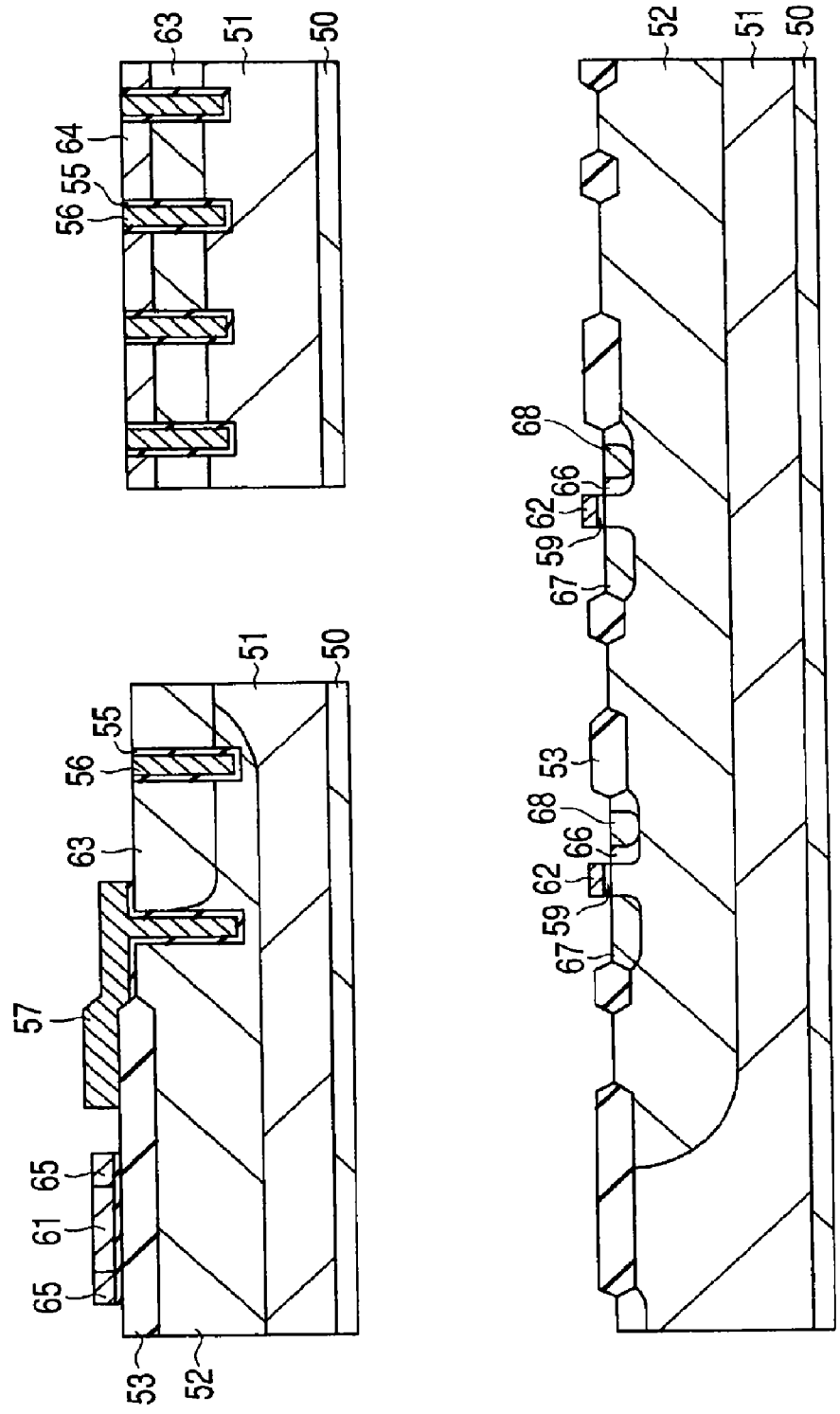
FIG. 23 is a sectional view following FIG. 22, showing the semiconductor device manufacturing process.

Next, as shown in FIG. 23, an n-type impurity comprised of phosphorus or arsenic or the like is introduced into the $p^-$-type epitaxial layer 51 by photolithography technology and the ion implantation method. Thus, a channel forming area 63 constituted of an $n^-$-type semiconductor region is formed in the p channel trench gate type power MISFET forming area. The channel forming area 63 is formed even in part of the boundary area. Thereafter, it is brought into alignment with each gate electrode 62 formed in the overheat cutoff circuit forming area by using photolithography technology and the ion implantation method to form a $p^-$-type semiconductor region 66. A p-type impurity is introduced by using the photolithography technology and the ion implantation method. According to this process step, a source region 64 corresponding to a $p^+$-type semiconductor region is formed over the channel forming area 63 in the p channel trench gate type power MISFET. On the other hand, each $p^+$-type semiconductor region 65 is formed in the polysilicon resistive element 61 in the boundary area. Further, $p^+$-type semiconductor regions 67 and $p^+$-type semiconductor regions 68 are formed in the overheat cutoff circuit forming area. The $p^+$-type semiconductor region 67 serves as a source region of each MISFET formed in the overheat cutoff circuit forming area. Similarly, the $p^-$-type semiconductor region 66 and the $p^+$-type semiconductor region 68 form a drain region of each MISFET formed in the overheat cutoff circuit forming area. Thus, the MISFET formed in the overheat cutoff circuit forming area takes an offset drain structure so as to be capable of maintaining a high breakdown voltage. That is, it has a structure in which each $p^-$-type semiconductor region 66 is formed between the gate electrode 62 and the $p^+$-type semiconductor region 68.

Figure 24:
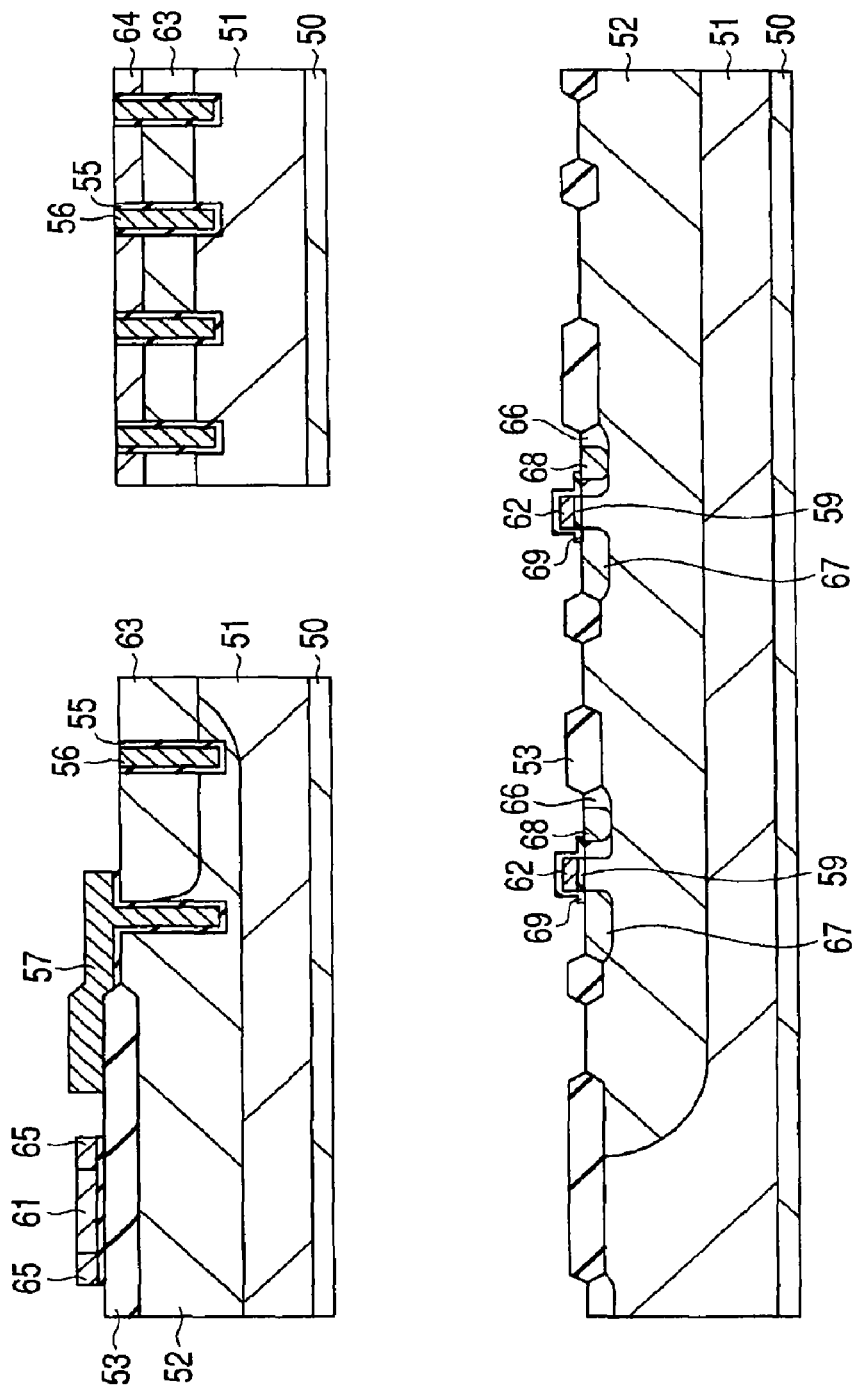
FIG. 24 is a sectional view following FIG. 23, showing the semiconductor device manufacturing process.

Subsequently, as shown in FIG. 24, a silicon oxide film is formed over the semiconductor substrate 50 and thereafter a silicon nitride film is formed over the silicon oxide film. An insulating film 69 comprising the silicon oxide film and the silicon nitride film is patterned by using the photolithography technology and etching technology. The patterning is done such that the insulating film covers each gate electrode 62.

Figure 25:
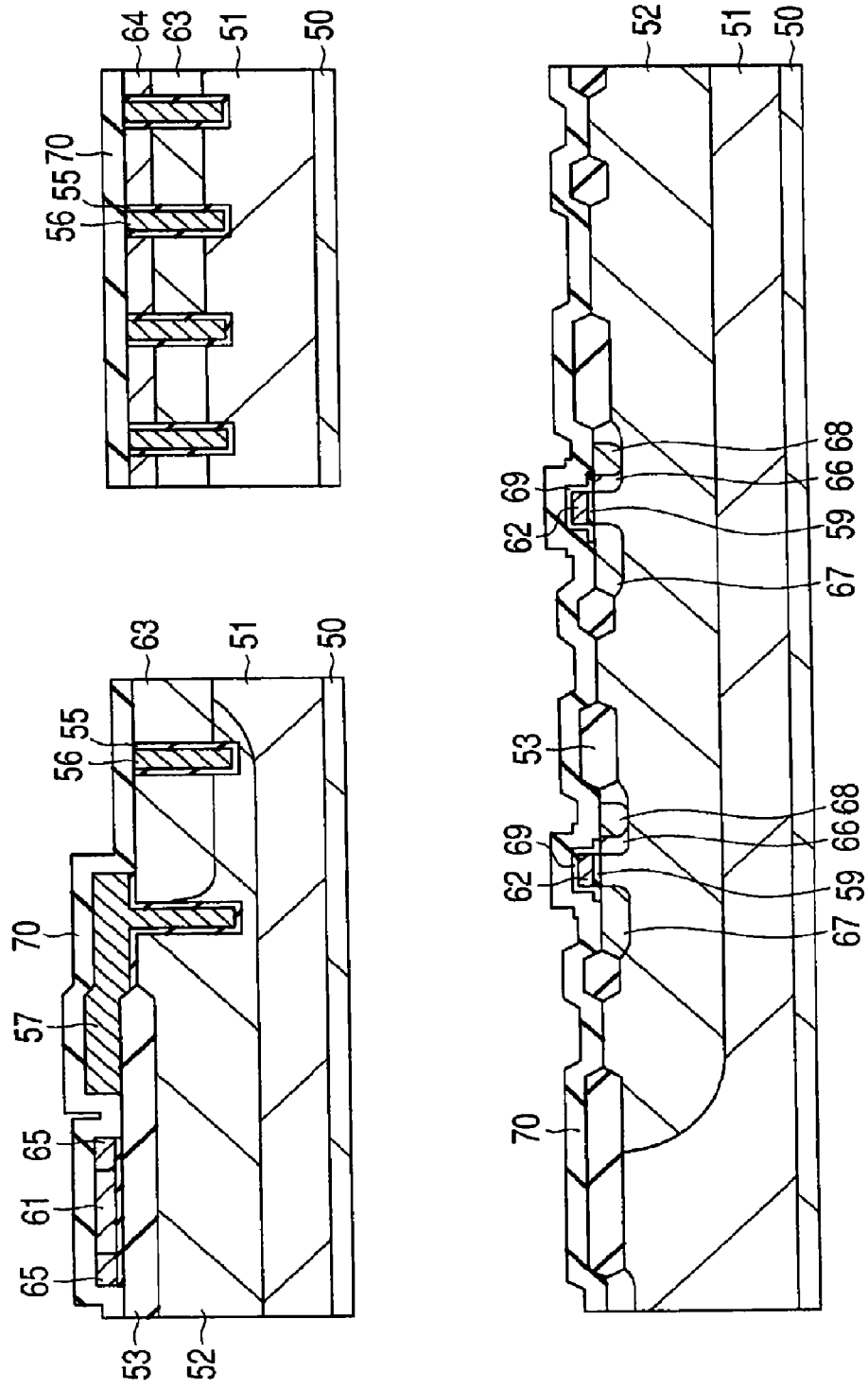
FIG. 25 is a sectional view following FIG. 24, showing the semiconductor device manufacturing process.

Next, as shown in FIG. 25, a PSG (Phospho Silicate Glass) film is formed over the semiconductor substrate 50. Thereafter, an SOG (Spin On Glass) film is applied onto the PSG film thereby to form an insulating film 70 comprising the PSG film and the SOG film.

Subsequently, a resist film patterned by photolithography technology is formed over the insulating film 70. The patterning is performed in such a manner that a region for forming each body contact trench is made open. The insulating film 70 is etched by etching with the patterned resist film as a mask. After the patterned resist film is removed, the semiconductor region is etched with the patterned insulating film 70 as a mask thereby to form each body contact trench 71 such as shown in FIG. 26.

Figure 27:
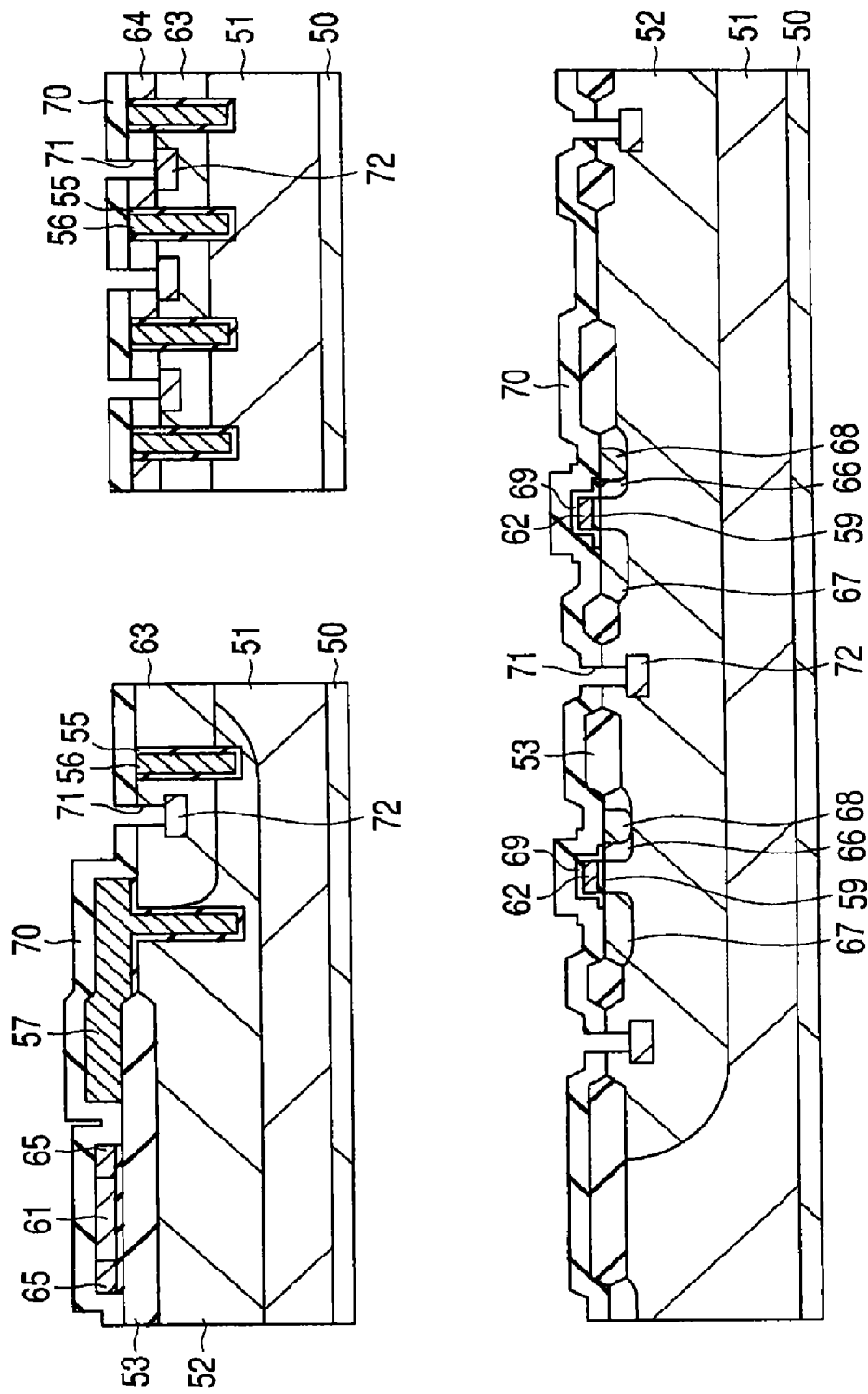
FIG. 27 is a sectional view following FIG. 26, showing the semiconductor device manufacturing process.

Thereafter, as shown in FIG. 27, ions are implanted onto the entire main surface of the semiconductor substrate 50 thereby to form a body contact region 72 composed of an $n^+$-type semiconductor region at the bottom of each body contact trench 71. Since each of the body contact regions 72 is formed in the neighborhood of a surface region of the bottom of the body contact trench 71, the body contact region 72 is formed by low-energy ion implantation. Thus, even though the ion implantation is done over the entire main surface of the semiconductor substrate 50, no problem occurs. That is, the body contact region 72 is formed at the bottom of the body contact trench 71 in a region in which each body contact trench 71 is formed, and the ion implantation is cut off or blocked by the insulating film 70 in a region other than the above region.

Figure 28:
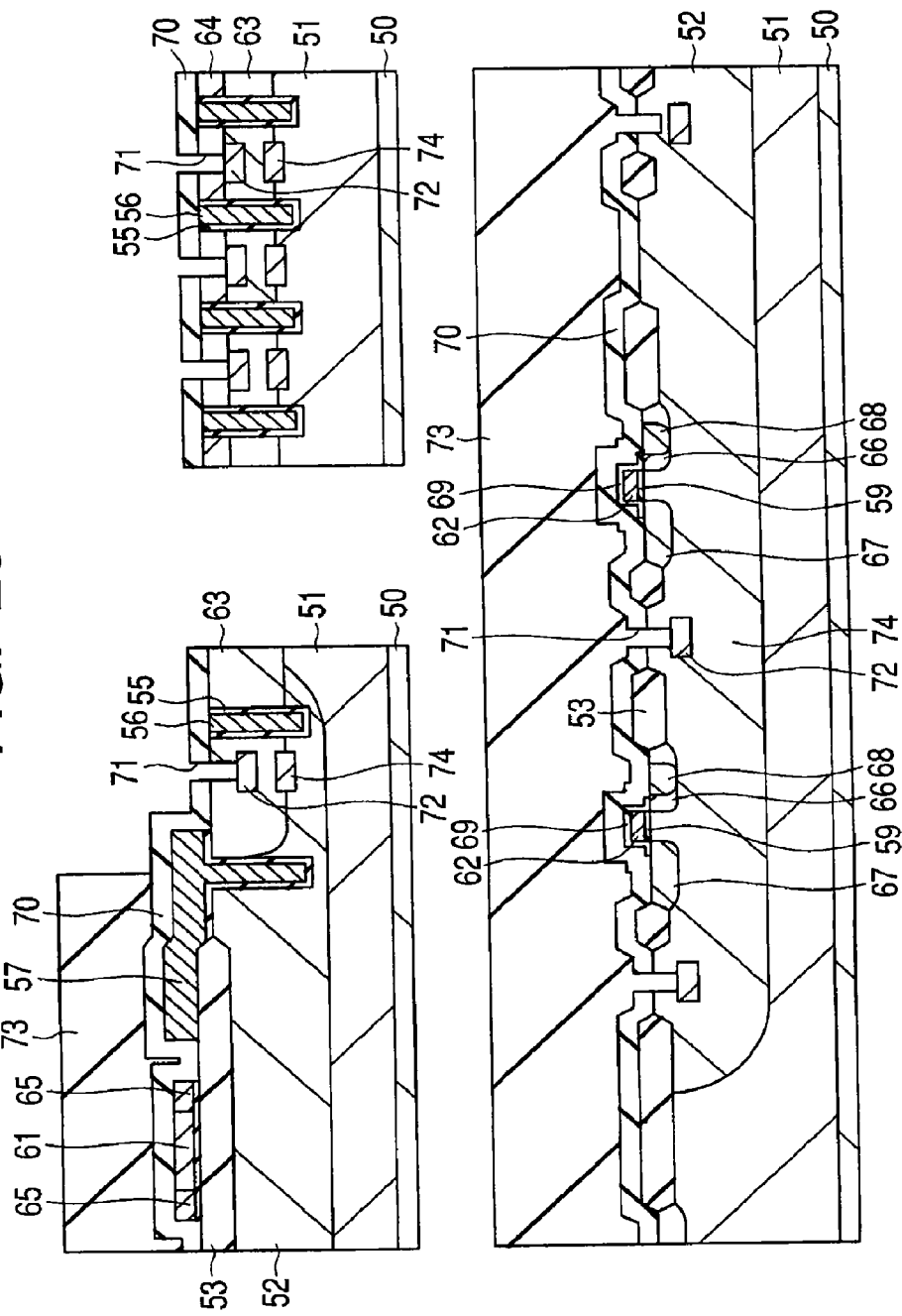
FIG. 28 is a sectional view following FIG. 27, showing the semiconductor device manufacturing process.

Next, as shown in FIG. 28, a resist film 73 is formed over the insulating film 70 by using photolithography technology. The resist film 73 is subjected to patterning. The patterning is done in such a manner that only the p channel trench gate type power MISFET forming area is made open. Ion implantation is performed with the patterned resist film 73 as a mask. Thus, an n-type semiconductor region 74 is formed in a deep region located directly below each body contact region 72. In the p channel trench gate type power MISFET forming area, each of the n-type semiconductor regions 74 is formed in a region deeper than the body contact region 72 and shallower than the bottom of the trench in which the gate electrode is formed. Further, the impurity concentration of the n-type semiconductor region 74 is higher than that of the channel forming area 63 and lower than that of each body contact region 72. Since the n-type semiconductor region 74 is formed in the deep region of the bottom of each body contact trench 71, the energy for ion implantation becomes high energy here. Therefore, there is a possibility that when ions are implanted into the entire main surface of the semiconductor substrate without forming the resist film 73, the ions will be implanted through the insulating film 70 depending upon the thickness of the insulating film 70 even in a region other than each body contact trench 71. Since a device is formed in the vertical direction in the p channel trench gate type power MISFET forming area, and the impurity concentration of the p-type source region 64 is overwhelmingly large as compared with the amount of impurity ions injected to form each n-type semiconductor region 74, the p channel trench gate type power MISFET forming area is not subjected to a large influence. However, there is a high possibility that the characteristic of each semiconductor element formed in the overheat cutoff circuit forming area will vary greatly, and it is presumed that an adverse effect will occur. Thus, in the first embodiment, the resist film 73 is formed and each n-type semiconductor region 74 is formed by ion implantation with the resist film 73 as a mask. Incidentally, the depth of the n-type semiconductor region 74 is formed to be larger than 100% (one times) and smaller than 120% (1.2 times) with respect to the depth of the channel forming area 63. Thus, while avalanche capability is enhanced, a reduction in breakdown voltage can be suppressed.

Figure 29:
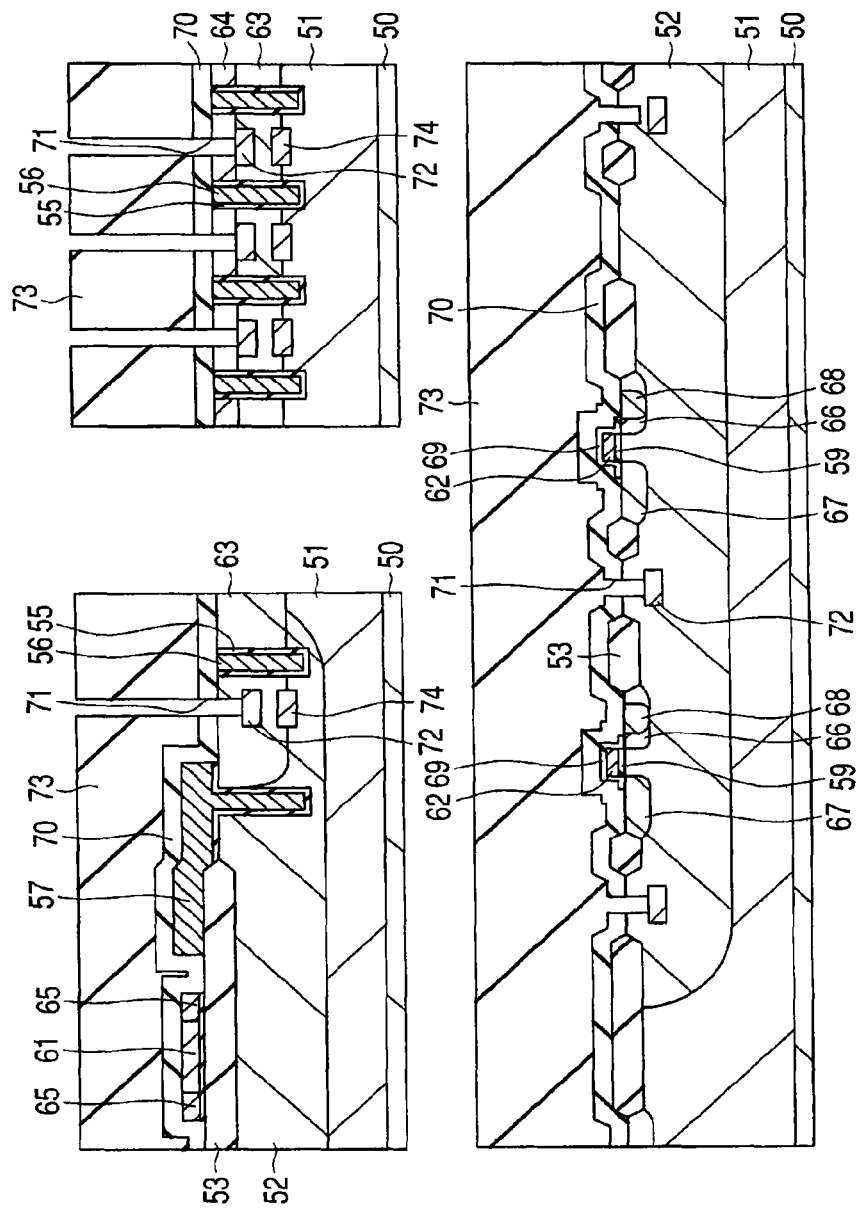
FIG. 29 is a sectional view showing examples for forming resist patterns different from FIG. 28.

When the depths of each trench and channel forming area 63 are fairly deep, it is necessary to execute ion implantation with higher energy for the purpose of forming each n-type semiconductor region 74. Since, at this time, there is a possibility that the ions will be implanted to the position deeper than the p-type source region 64 thereby to vary the characteristic of the p channel trench gate type power MISFET, patterning is preferably carried out as shown in FIG. 29.

Figure 30:
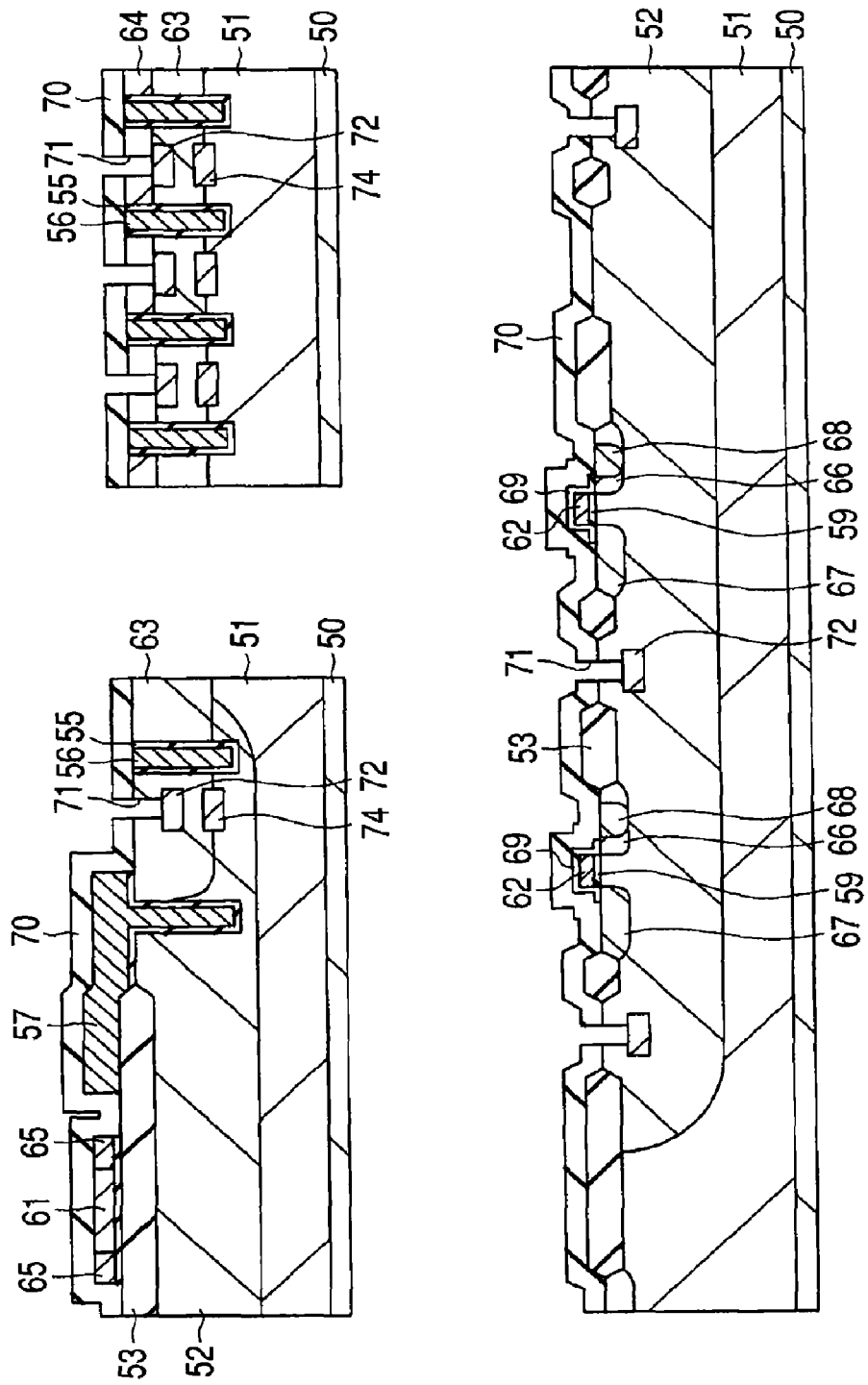
FIG. 30 is a sectional view following FIG. 28, showing the semiconductor device manufacturing process.
Figure 31:
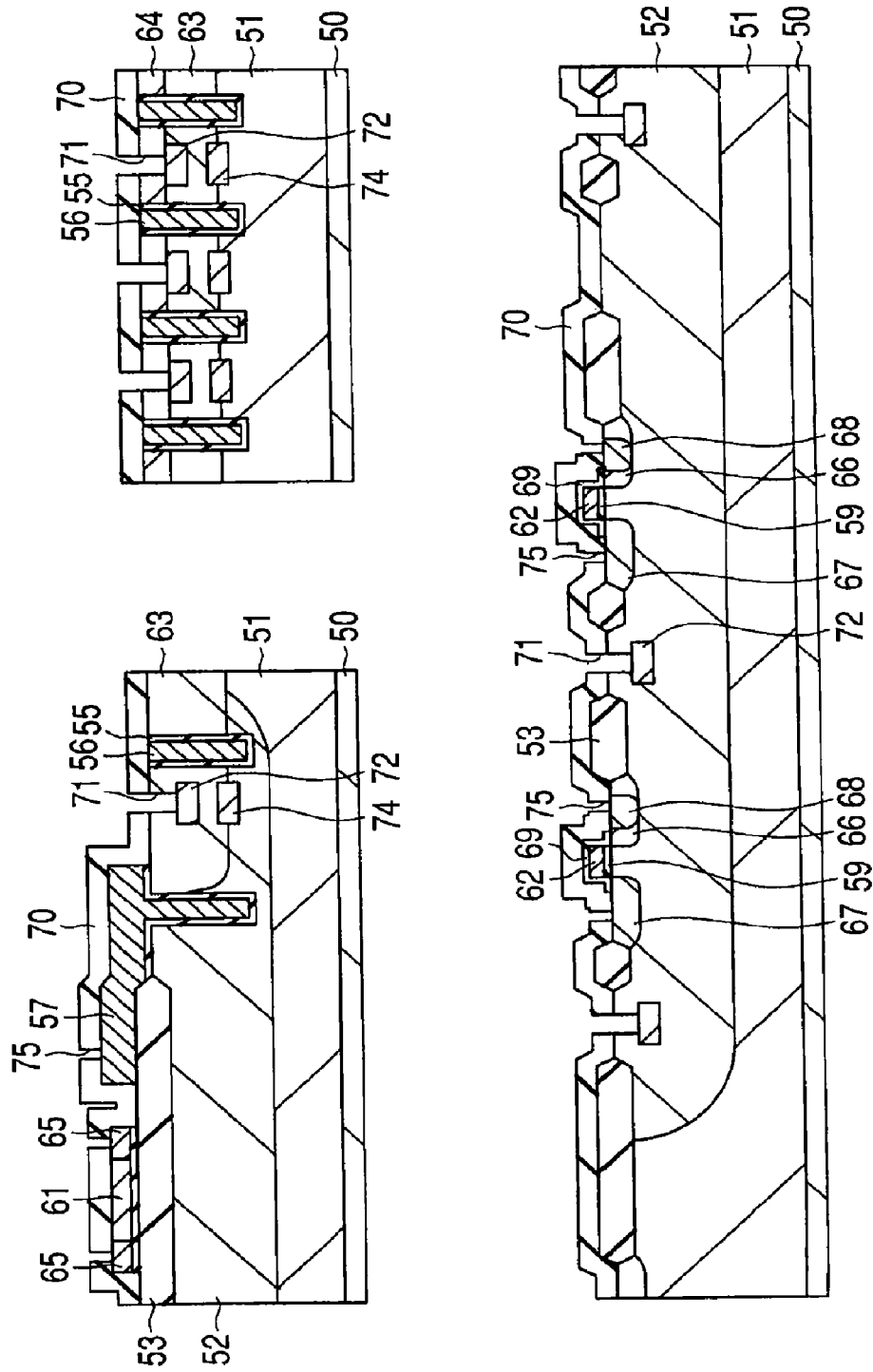
FIG. 31 is a sectional view following FIG. 30, showing the semiconductor device manufacturing process.

Subsequently, after the removal of the resist film 73 as shown in FIG. 30, connection holes 75 are formed in the insulating film 70 by using photolithography technology and etching technology as shown in FIG. 31. In the boundary area, the connection holes 75 include one that reaches the gate lead-out electrode 57 and ones that reach the $p^+$-type semiconductor regions 65 of the polysilicon resistive element 61. On the other hand, the connection holes 75 include ones that reach the $p^+$-type semiconductor regions (source regions) 67 and ones that reach the $p^+$-type semiconductor regions (drain regions) 68 in the overheat cutoff circuit forming area.

Figure 32:
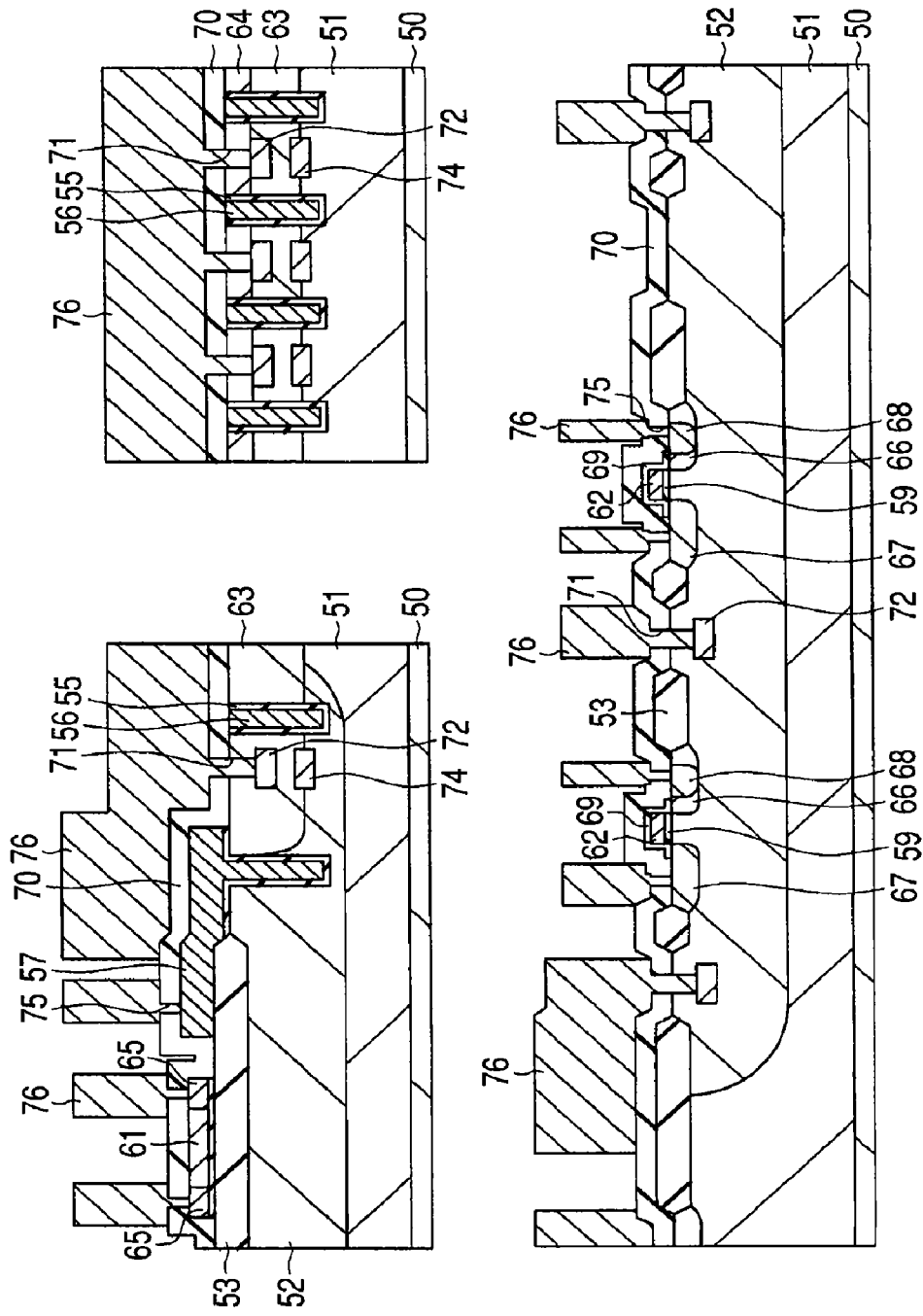
FIG. 32 is a sectional view following FIG. 31, showing the semiconductor device manufacturing process.

Next, as shown in FIG. 32, a barrier conductive film (not shown) is formed over the insulating film 70 including each body contact trench 71 and each connection hole 75. The barrier conductive film is formed of, for example, a TiW (titanium tungsten) film. The barrier conductive film can be formed using a sputtering method, for example. The barrier conductive film has a so-called barrier property that aluminium corresponding to a material for an embedding film is prevented from being diffused into silicon in a subsequent process step, for example. After the formation of an aluminium film over the barrier conductive film, the aluminum film and the barrier conductive film are patterned by using photolithography technology and etching technology, thereby forming a wiring 76. Although an example formed from the aluminium film is illustrated as the wiring 76, for example, silicon (Si) and copper (Cu) may be contained in the aluminium film. The gate lead-out electrode 57 and the polysilicon resistive element 61 are connected by the wiring 76. Therefore, the gate electrode 56 of the p channel trench gate type power MISFET and the polysilicon resistive element 61 are connected in series. The polysilicon resistive element 61 is, for example, a gate cutoff resistor in an overheat cutoff circuit.

Subsequently, a protective film (not shown) is formed so as to cover the insulating film 70 and the wiring 76. Thereafter, predetermined regions on the wiring 76 are made open by photolithography technology and etching technology to form electrode pads. Gate and source pads are formed as the electrode pads. Thus, the corresponding p channel trench gate type power MISFET with the overheat cutoff circuit built therein can be formed.

Second Preferred Embodiment

A second embodiment will explain a method of forming body contact trenches deeper as compared with the first embodiment and forming n-type semiconductor regions for intentionally changing an avalanche breakdown point, in a layer below the body contact trenches.

Figure 33:
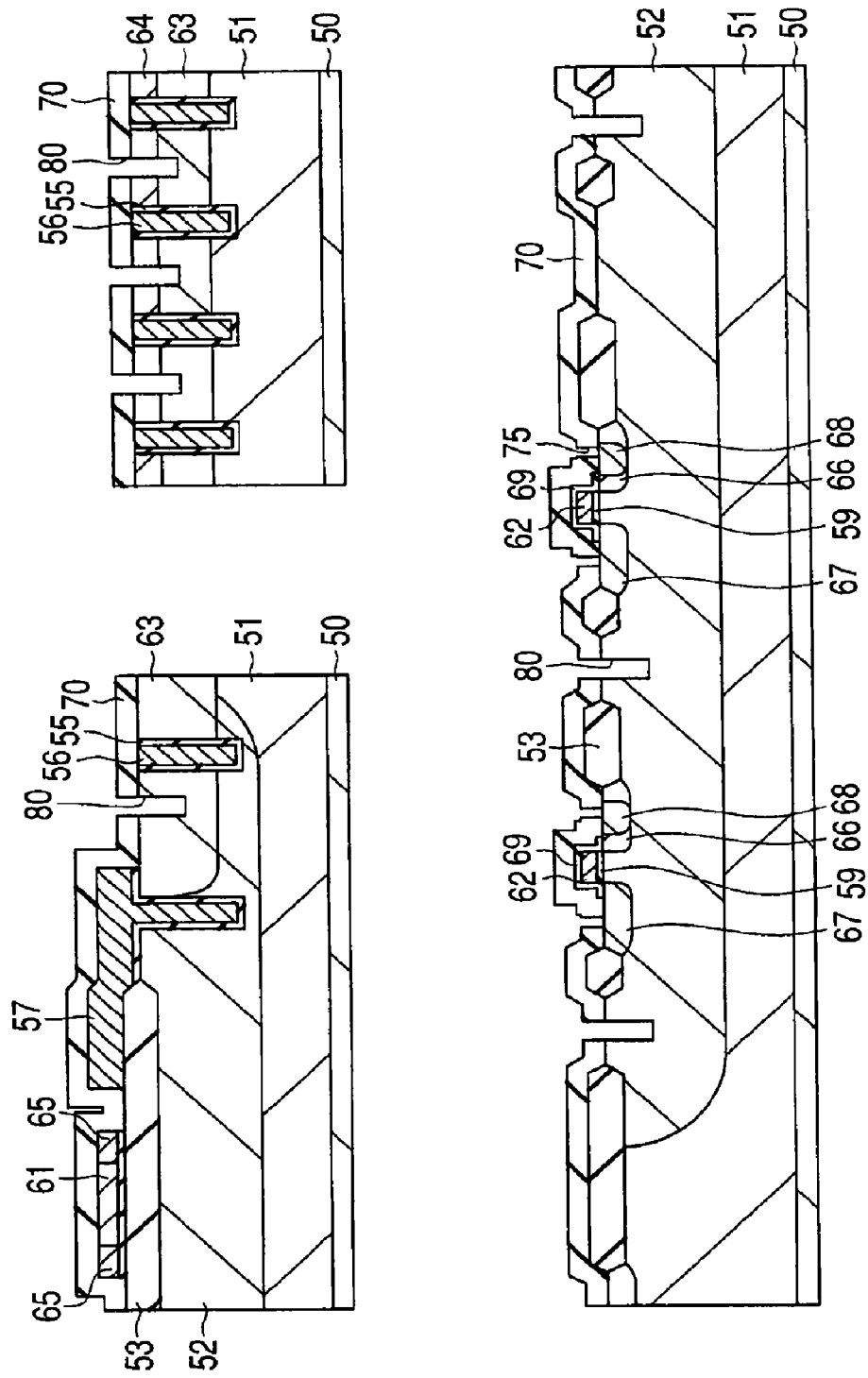
FIG. 33 is a sectional view showing a process of manufacturing a semiconductor device according to a second embodiment.

Process steps from FIGS. 17 to 25 are similar to the first embodiment. Next, as shown in FIG. 33, a resist film subjected to patterning using photolithography technology is formed over the insulating film 70. The patterning of the resist film is done in such a manner that the region for forming each body contact trench is made open. The insulating film 70 is etched and patterned with the patterned resist film as a mask. Subsequently, after the removal of the resist film, body contact trenches 80 that reach the channel forming area 63 are formed with the patterned insulating film 70 as a mask. The depth of each body contact trench 80 is formed deeper than that of each body contact trench 71 (refer to FIG. 26) formed in the first embodiment.

Figure 34:
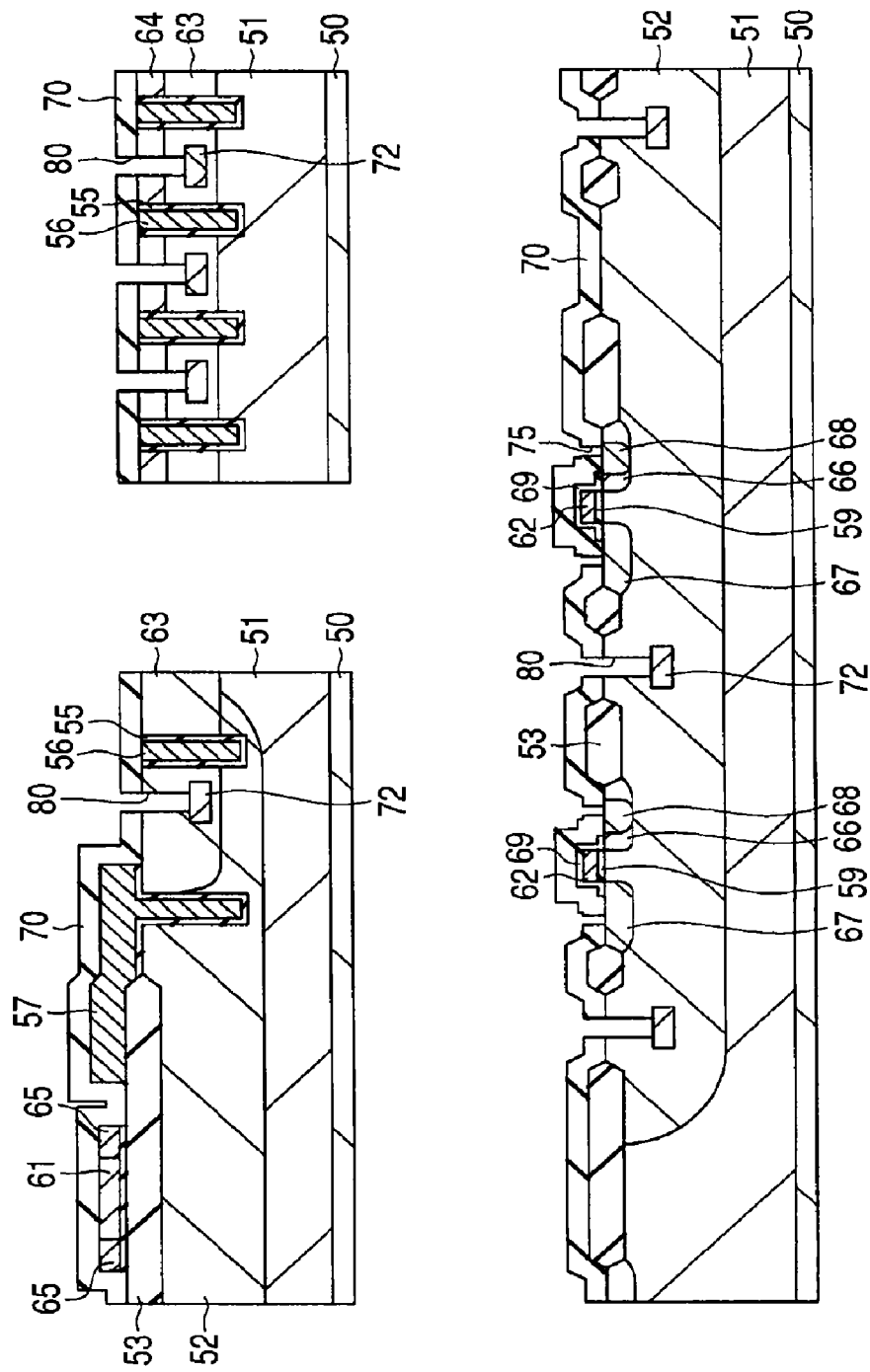
FIG. 34 is a sectional view following FIG. 33, showing the semiconductor device manufacturing process.

Subsequently, as shown in FIG. 34, ion implantation is effected on the entire main surface of the semiconductor substrate 50 without using the mask based on the resist film thereby to form body contact regions 72 each constituted of an $n^+$-type semiconductor region at the bottoms of the body contact trenches 80. Thereafter, as shown in FIG. 35, ion implantation is effected on the entire main surface of the semiconductor substrate 50 without using the mask based on the resist film thereby to form n-type semiconductor regions 74 directly below the body contact regions 72.

In the first embodiment, the energy for ion implantation was set as high energy since the n-type semiconductor regions 74 were formed in the regions deeper as viewed from the bottoms of the body contact trenches 71 as shown in FIG. 28. Therefore, there is a circumstance that when the ions are implanted onto the entire main surface of the semiconductor substrate without forming the resist film 73, the ions are injected through the insulating film 70 in the regions other than the body contact trenches 71 depending upon the thickness of the insulating film 70. In doing so, it is presumed that adverse effects such as a variation in the characteristic of each semiconductor element, etc. will occur. Thus, in the first embodiment, the resist film 73 was formed and the n-type semiconductor region 74 was formed by ion implantation with the resist film 73 as the mask.

Figure 35:
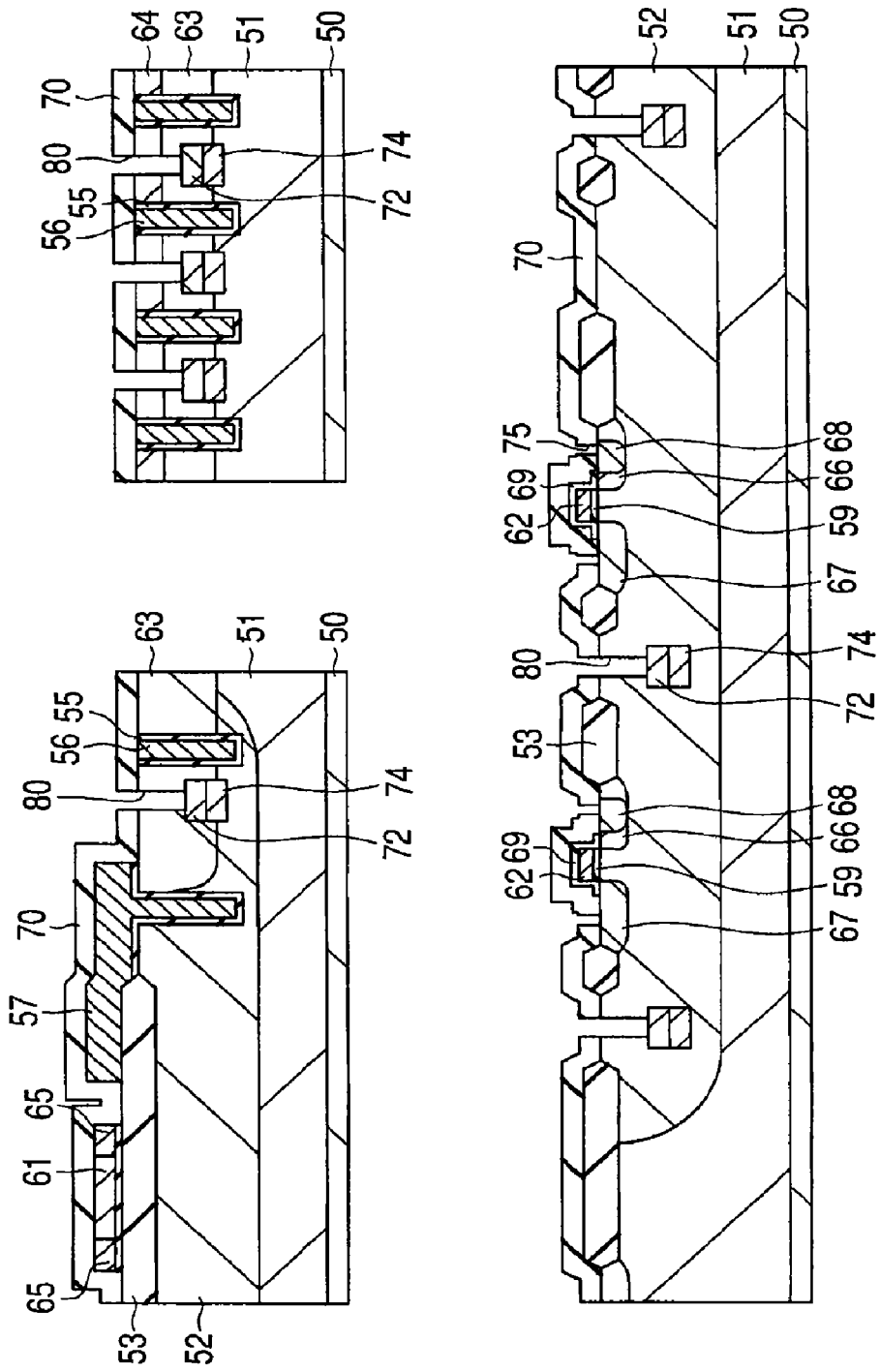
FIG. 35 is a sectional view following FIG. 34, showing the semiconductor device manufacturing process.

On the other hand, in the second embodiment, the depth of each body contact trench 80 is formed deeper as shown in FIG. 35. Therefore, the n-type semiconductor regions 74 formed directly below the body contact regions 72 can be formed by ion implantation of energy lower than the first embodiment. Therefore, in the second embodiment, ions are implanted on the entire main surface of the semiconductor substrate 50 without using the resist film as the mask upon ion implantation for forming each n-type semiconductor region 74. Thus, according to the second embodiment, there is an advantage in that since it is unnecessary to use the mask based on the resist film as in the first embodiment upon forming each n-type semiconductor region 74, a manufacturing process can be simplified. That is, while the n-type semiconductor region 74 can be formed with the depth of each body contact trench 80, it can be formed without using the mask based on the resist film by forming the insulating film 70 at an ion penetration-free depth. Since no ions penetrate the insulating film 70, it is possible to prevent adverse effects such as a variation in characteristic from being exerted on each semiconductor element formed in the overheat cutoff circuit forming area. Incidentally, although there is a case where the body contact region 72 and the n-type semiconductor region 74 are brought into contact with each other by bringing the depth of each body contact trench 80 into deep-grooved form, no problem occurs in electric characteristics.

Subsequent process steps are similar to the first embodiment. Even in the second embodiment as described above, effects similar to the first embodiment can be obtained.

The advantage of the manufacturing method according to the first embodiment and the advantage of the manufacturing method according to the second embodiment will next be explained. The advantage according to the second embodiment resides in that the n-type semiconductor region 74 can be formed without using the mask based on the resist film by bringing each body contact trench 80 into deep-grooved form as described above. That is, there is an advantage that the manufacturing process can be simplified.

There is however a fear that when each body contact trench 80 is brought into deep-grooved form, the aspect ratio of the body contact trench 80 becomes larger and embeddability is degraded upon formation of the wiring 76 that buries the body contact trench 80. Particularly when a cell pith is reduced, this point becomes manifest.

On the other hand, since the mask based on the resist film is used when the n-type semiconductor region 74 is formed, it is necessary to add the manufacturing process steps in the first embodiment. Since, however, the body contact trench 80 is not brought into deep-grooved form, a rise in the aspect ratio of the body contact trench 80 can be suppressed to a minimum even when the pitch of each cell is miniaturized.

Considering the embeddability of the wiring 76 from the above, the manufacturing method according to the second embodiment is suitable where the cell pitch is relatively wide and the aspect ratio of the body contact trench 80 does not present a problem so much. On the other hand, when the cell pitch is relatively narrow and the aspect ratio of the body contact trench 80 presents a problem due to its deep-grooved form, it can be said that the manufacturing method according to the first embodiment is suitable.

While the invention made above by the present inventors has been described specifically on the basis of the preferred embodiments, the present invention is not limited to the embodiments referred to above. It is needless to say that various changes can be made thereto without the scope not departing from the gist thereof.

The present invention can widely be utilized for the manufacturing industry for manufacturing a semiconductor device.

What is claimed is:

1. A method for manufacturing a semiconductor device including a trench gate type MISFET having a p-type channel and a resistive element provided between a gate pad and a gate electrode of the trench gate type MISFET, comprising the steps of:
   (a) forming a p-type semiconductor region over a semiconductor substrate;
   (b) forming a trench in the p-type semiconductor region;
   (c) forming a gate insulating film over an inner wall of the trench;
   (d) forming a gate electrode so as to bury the trench;
   (e) forming an n-type channel forming area in an area shallower than the trench of the p-type semiconductor region;
   (f) forming a p-type source region in a surface region shallower than the bottom of the n-type channel forming area;
   (g) forming a first n-type semiconductor region in the n-type channel forming area; and
   (h) forming a second n-type semiconductor region in an area deeper than the first n-type semiconductor region and shallower than the bottom of the trench,
   wherein an impurity concentration of the second n-type semiconductor region is lower than that of the first n-type and higher than that of the n-type channel forming area.

2. The method according to claim 1, wherein the resistance value of the resistive element ranges from 5 kΩ to 20 kΩ.

3. The method according to claim 1, wherein the distance from an upper surface of the p-type source region to the bottom of the second n-type semiconductor region is larger than one times the distance from the upper surface of the p-type source region to the bottom of the n-type channel forming area and smaller than 1.2 times the distance.

4. The method according to claim 1, further including the step of:
   (i) forming body contact trenches in the n-type channel forming area after the step (f),
   wherein, in the step (g), the first n-type semiconductor region is formed at the bottom of each of the body contact trenches.

5. The method according to claim 1, further including the step of:
   (j) forming an interlayer insulating film over the trenches and the p-type source region before the step (h) after the step (f).

6. The method according to claim 5, further including the step of:
 (k) forming, over the interlayer insulating film, a resist film subjected to patterning for creating openings over an area for forming the second n-type semiconductor region after the step (j),
 wherein, in the step (h), the second n-type semiconductor region is formed by an ion implantation method with the resist film as a mask after the step (k).

7. The method according to claim 1, further including the steps of:
 (l) forming an interlayer insulting film over the trenches and the p-type source region after the step (f), and
 (m) forming body contact trenches reaching the interior of the n-type channel forming area through the interlayer insulating film,
 wherein, in the step (g), the first n-type semiconductor region is formed at the bottom of each of the body contact trenches by ion implantation into the entire main surface of the semiconductor substrate, and
 wherein, in the step (h), the second n-type semiconductor region is formed in a region deeper than the first n-type semiconductor region by ion implantation into the entire main surface of the semiconductor substrate, and the depth of the body contact trench is formed at a depth free of penetration of ions through the interlayer insulating film while being capable of the second n-type semiconductor region.

* * * * *